(12) United States Patent
Watanabe et al.

(10) Patent No.: US 12,519,463 B2
(45) Date of Patent: Jan. 6, 2026

(54) POWER SUPPLY SWITCHING CIRCUIT

(71) Applicants: Kabushiki Kaisha Toshiba, Tokyo (JP); Toshiba Electronic Devices & Storage Corporation, Tokyo (JP)

(72) Inventors: Masatoshi Watanabe, Kawasaki Kanagawa (JP); Tsuneyuki Hayashi, Kodaira Tokyo (JP); Shuuji Toda, Kawasaki Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 306 days.

(21) Appl. No.: 18/244,173

(22) Filed: Sep. 8, 2023

(65) Prior Publication Data

US 2024/0322681 A1  Sep. 26, 2024

(30) Foreign Application Priority Data

Mar. 24, 2023  (JP) ................................. 2023-048714

(51) Int. Cl.
*H03K 17/00* (2006.01)
*H02J 9/06* (2006.01)

(52) U.S. Cl.
CPC ............ *H03K 17/005* (2013.01); *H02J 9/068* (2020.01)

(58) Field of Classification Search
CPC ........ H02J 9/068; H03K 17/00; H03K 17/005
USPC .................... 307/80, 85, 86; 327/407, 408
See application file for complete search history.

(56) References Cited

U.S. PATENT DOCUMENTS

| | | | | |
|---|---|---|---|---|
| 5,910,750 | A | * | 6/1999 | Harada .................... G06F 1/263 327/544 |
| 8,693,225 | B2 | | 4/2014 | Yoshino et al. |
| 2008/0174277 | A1 | | 7/2008 | Ueno |
| 2009/0115374 | A1 | * | 5/2009 | Noda ......................... H02J 1/10 320/138 |
| 2009/0167410 | A1 | * | 7/2009 | Yoshikawa ........... H03K 17/693 327/427 |
| 2010/0225169 | A1 | * | 9/2010 | Hanawa ................ H03K 17/302 307/127 |

(Continued)

FOREIGN PATENT DOCUMENTS

| | | |
|---|---|---|
| JP | 2008-182822 A | 8/2008 |
| JP | 2010-104195 A | 5/2010 |

(Continued)

*Primary Examiner* — William Hernandez
(74) *Attorney, Agent, or Firm* — Kim & Stewart LLP

(57) ABSTRACT

According to one embodiment, a semiconductor device includes: a switch circuit including a first switch configured to control an output of a first power supply voltage, and a second switch configured to control an output of a second power supply voltage, the switch circuit being configured to switch the first power supply voltage and the second power supply voltage; and a control circuit configured to receive a first control signal related to an input of the first power supply voltage, and a second control signal related to an input of the second power supply voltage, configured to detect the inputs of the first and second power supply voltages, and configured to control an operation mode of the switch circuit, based on a detection result of the first and second control signals and the first and second power supply voltages.

20 Claims, 14 Drawing Sheets

(56) References Cited

U.S. PATENT DOCUMENTS

| | | | | |
|---|---|---|---|---|
| 2012/0080951 A1* | 4/2012 | Kung | ............ | H02J 7/35 |
| | | | | 307/48 |
| 2023/0421153 A1 | 12/2023 | Nagasawa et al. | | |
| 2025/0167587 A1* | 5/2025 | Chen | ............ | H02J 9/061 |
| 2025/0175172 A1* | 5/2025 | Lai | ............ | H02M 1/088 |

FOREIGN PATENT DOCUMENTS

| | | |
|---|---|---|
| JP | 2015-198474 A | 11/2015 |
| JP | 2024-02260 A | 1/2024 |

* cited by examiner

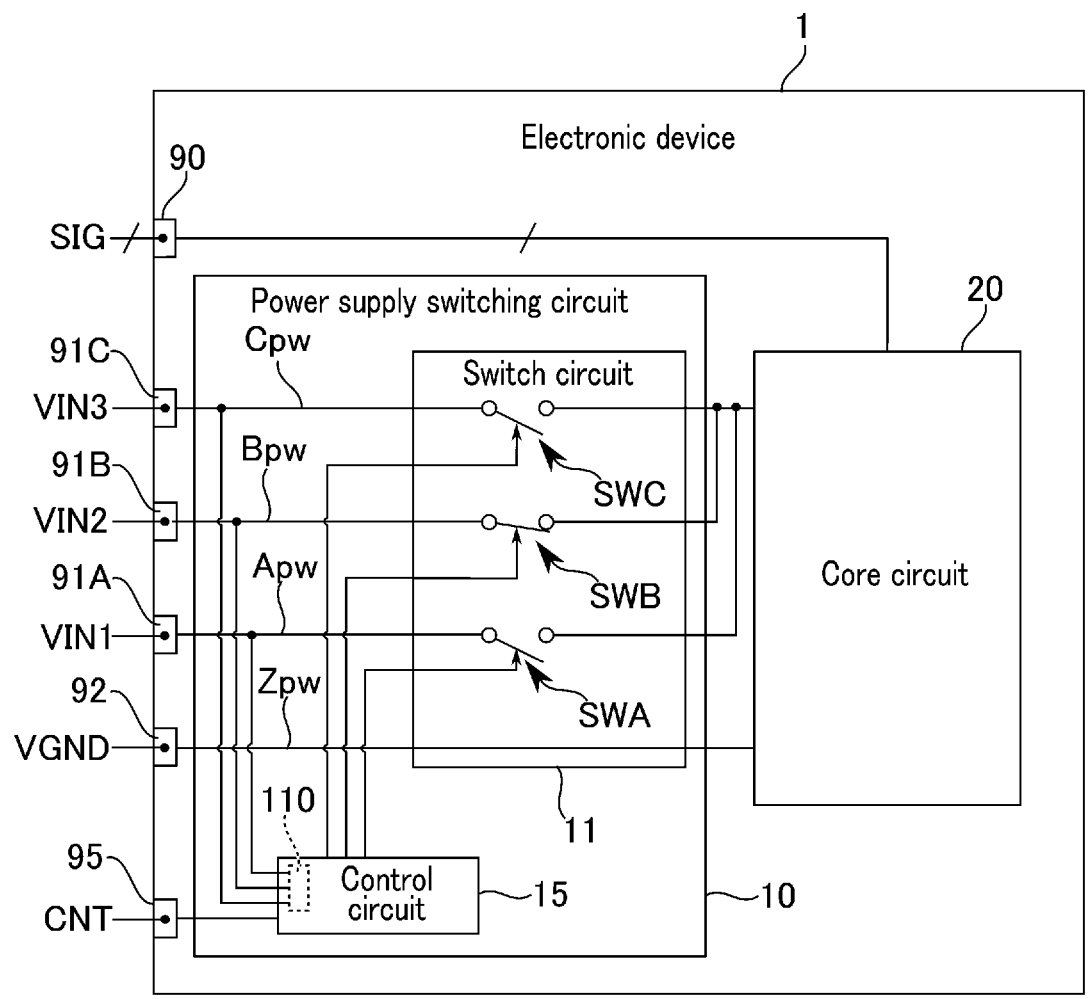
F I G. 1

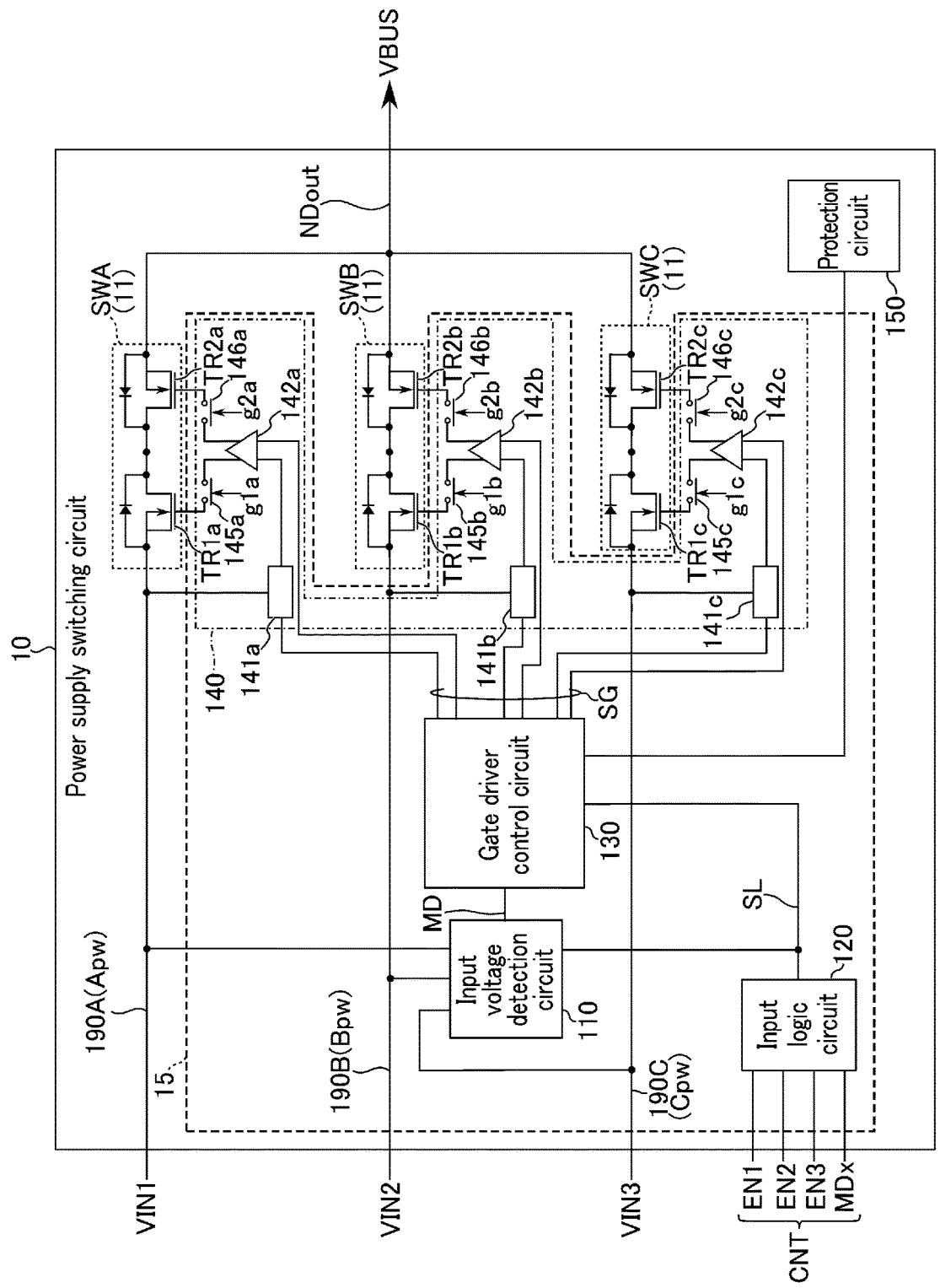
F I G. 3

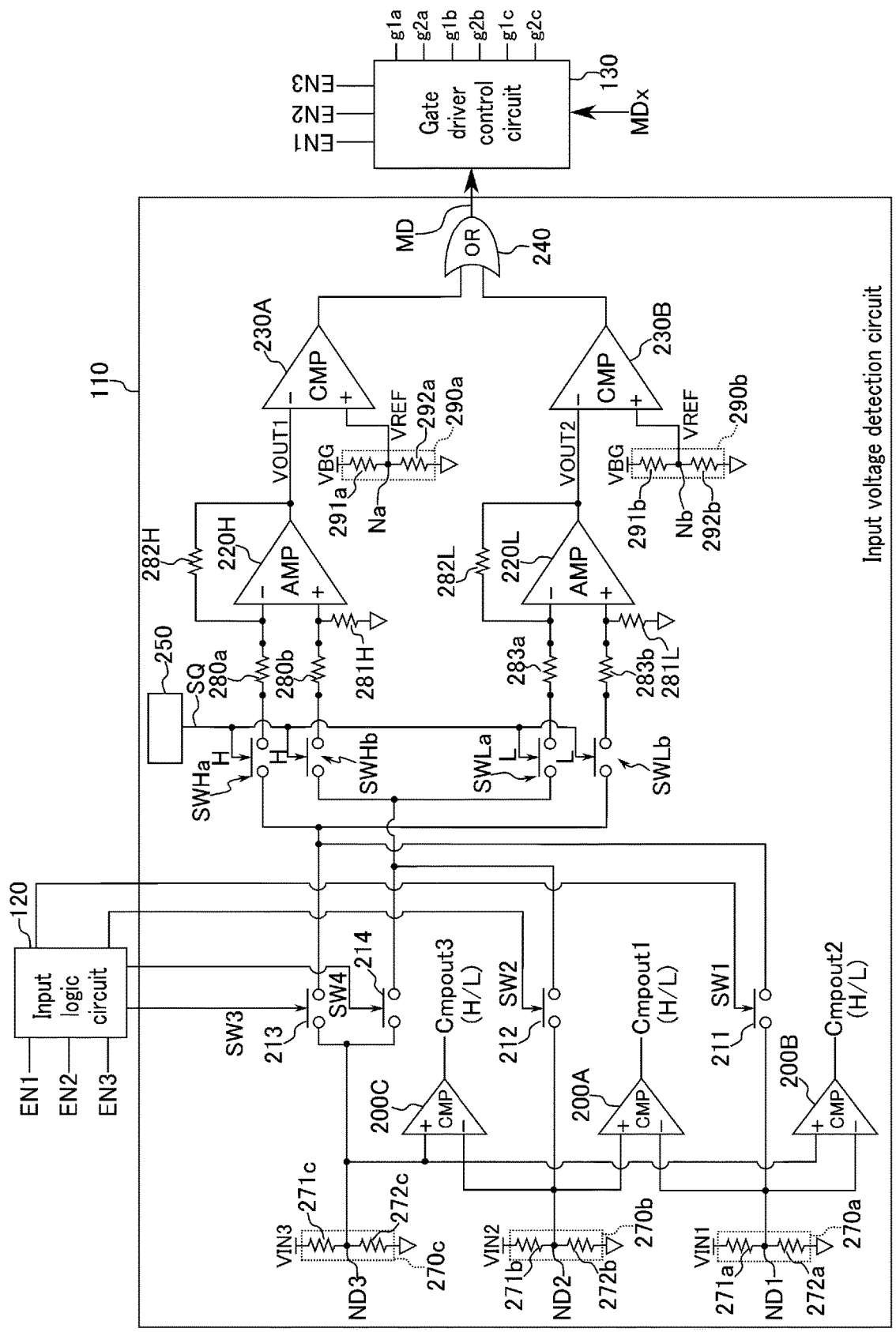
F I G. 4

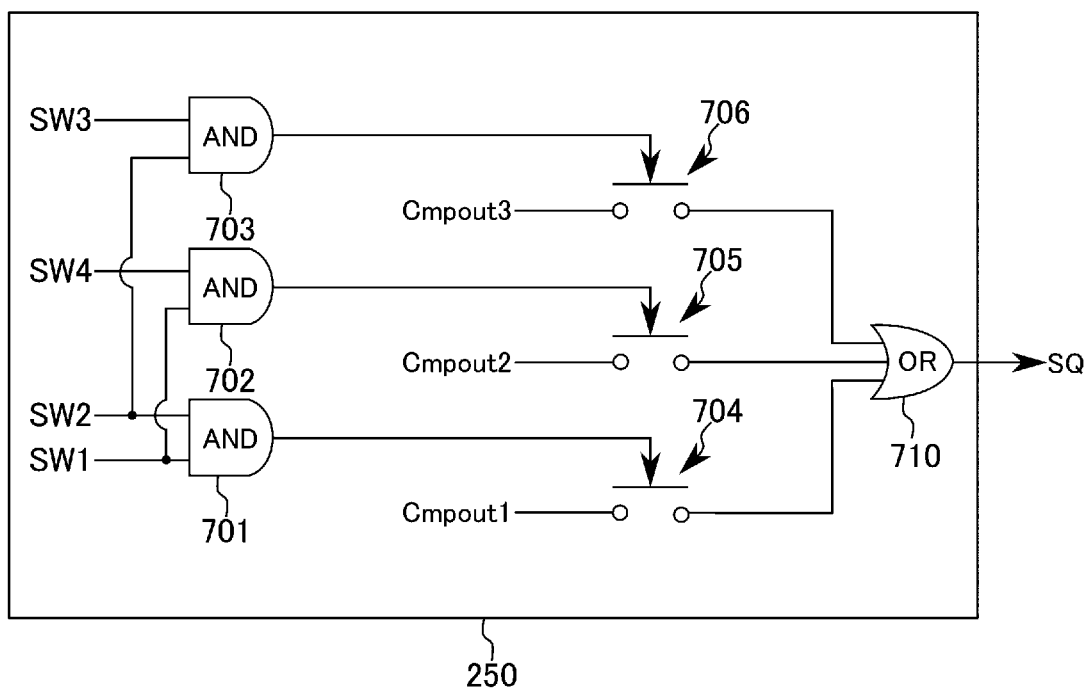
F I G. 5

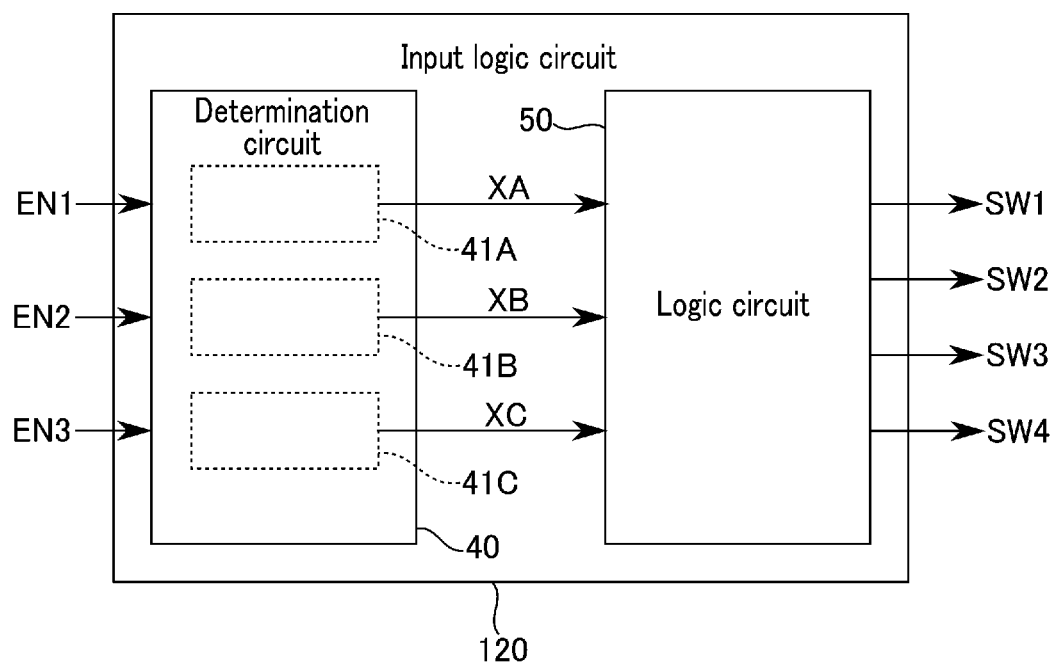
F I G. 6 ic circuit.

POWER SUPPLY SWITCHING CIRCUIT

CROSS-REFERENCE TO RELATED APPLICATIONS

This application is based upon and claims the benefit of priority from Japanese Patent Application No. 2023-048714, filed Mar. 24, 2023, the entire contents of which are incorporated herein by reference.

FIELD

Embodiments described herein relate generally to a semiconductor circuit.

BACKGROUND

A semiconductor circuit is required to switch a power supply by an appropriate mode in accordance with a purpose of use of a device or a connection destination of the device.

BRIEF DESCRIPTION OF THE DRAWINGS

FIG. 1 is a diagram illustrating a configuration example of an electronic device including a semiconductor circuit of an embodiment.

FIG. 3 is a diagram illustrating a configuration example of the semiconductor circuit of the embodiment.

FIG. 4 is a diagram illustrating a configuration example of an input voltage detection circuit of the semiconductor circuit of the embodiment.

FIG. 5 is a diagram illustrating a configuration example of the input voltage detection circuit of the semiconductor circuit of the embodiment.

FIG. 6 is a diagram illustrating a configuration example of an input logic circuit of the semiconductor circuit of the embodiment.

DETAILED DESCRIPTION

Figure 2:
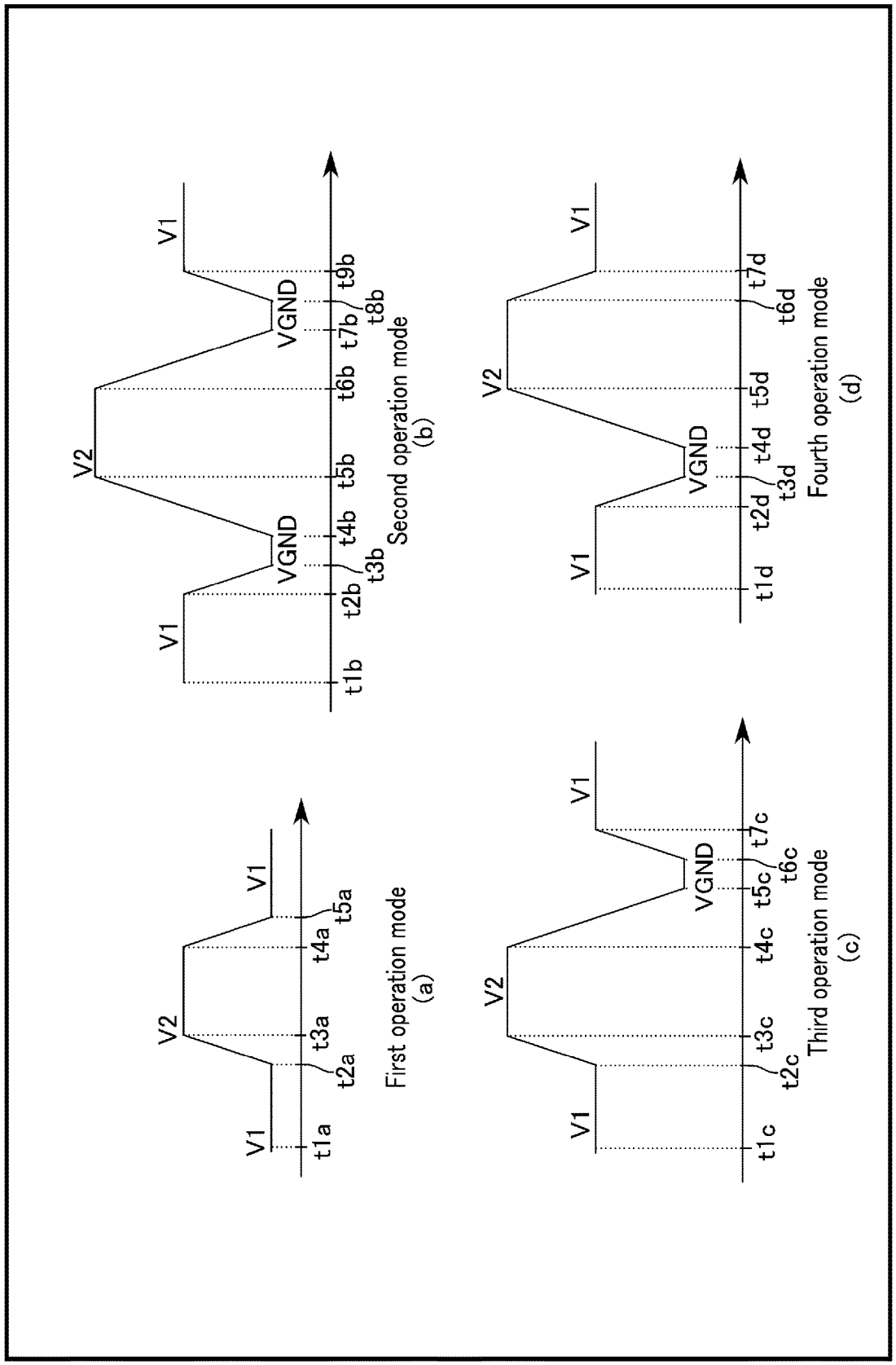
FIG. 2 is a diagram illustrating operation modes of the semiconductor circuit of the embodiment.

Hereinafter, referring to FIG. 1 to FIG. 14, a semiconductor circuit of the present embodiment is described in detail.

In the description below, elements having the same function and structure are denoted by the same reference sign. In addition, in each embodiment below, in a case where constituent elements (for example, circuits, interconnects, and various voltages and signals), which are denoted by reference signs ending with numerals/alphabetical characters for distinction, do not need to be distinguished, expressions (reference signs) without such numerals/alphabetical characters at the ends are used.

In general, according to one embodiment, a semiconductor circuit includes: a switch circuit including a first switch configured to control an output of a first power supply voltage, and a second switch configured to control an output of a second power supply voltage, the switch circuit being configured to switch the first power supply voltage and the second power supply voltage; and a control circuit configured to receive a first control signal related to an input of the first power supply voltage, and a second control signal related to an input of the second power supply voltage, configured to detect the inputs of the first and second power supply voltages, and configured to control an operation mode of the switch circuit, based on a detection result of the first and second control signals and the first and second power supply voltages.

Embodiment

(1) Configuration Example

Referring to FIG. 1 to FIG. 12, a configuration example of a semiconductor circuit of the present embodiment is described.

FIG. 1 is a diagram for describing an electronic device including the semiconductor circuit of the embodiment.

As illustrated in FIG. 1, an electronic device 1 includes a semiconductor circuit 10 of the present embodiment, and a core circuit 20. For example, the electronic device 1 is a healthcare device, a medical device, an industrial machine, an audio device, a video device, a portable terminal, a large-capacity power supply device, or a charging device.

The core circuit 20 receives, via a plurality of signal lines, a signal SIG that is supplied to a terminal (connector) 90. Based on the received signal SIG, the core circuit 20 executes various signal processes and/or operation sequences. The core circuit 20 outputs a signal SIG, which is generated by an internal process, to the outside of the electronic device 1 via a plurality of signal lines.

The semiconductor circuit 10 of the present embodiment is a power supply switching circuit 10.

The power supply switching circuit 10 is connected to a plurality of power supply systems (power supply lines) Apw, Bpw, Cpw and Zpw. The power supply system Apw receives a power supply voltage (also referred to as "input voltage") VIN1 via a power supply terminal (power supply connector) 91A. The power supply system Bpw receives a power supply voltage VIN2 via a power supply terminal 91B. The power supply system Cpw receives a power supply voltage VIN3 via a power supply terminal 91C. The power supply system Zpw receives a ground voltage VGND via a power supply terminal 92. The power supply voltages VIN1, VIN2 and VIN3 have mutually different positive voltage values. The ground voltage VGND is, for example, 0 V. There is a case where the ground voltage VGND has a positive voltage value lower than the power supply voltages VIN1, VIN2 and VIN3 or negative voltage value.

For example, the power supply system Apw is supplied with the power supply voltage VIN1 from a battery (for example, a rechargeable battery). For example, the power supply system Bpw is supplied with the power supply voltage VIN2 from a wireless power feeding device. The power supply system Cpw is supplied with the power supply voltage VIN3 from a cable (for example, a power supply cable or a USB cable).

The power supply switching circuit 10 supplies one of the supplied power supply voltages VIN1, VIN2 and VIN3 to the core circuit 20.

The power supply switching circuit 10 includes a switch circuit 11 and a control circuit 15.

The switch circuit 11 transfers each voltage VIN1, VIN2, VIN3, VGND to the core circuit 20. The switch circuit 11 includes a plurality of switches SWA, SWB and SWC for controlling the supply (output) and shutoff of the power supply voltages VIN1, VIN2 and VIN3 for the core circuit 20.

The switch SWA corresponds to the power supply system Apw. One end (a node, a terminal) of the switch SWA is connected to the power supply system Apw. The other end (a node, a terminal) of the switch SWA is connected to the core circuit 20 via an output terminal of the switch circuit 11. In a case where the switch SWA is in the ON state, the switch SWA transfers (supplies, outputs) the voltage VIN1 to the core circuit 20. In a case where the switch SWA is in the OFF state, the switch SWA shuts off the voltage VIN1.

The switch SWB corresponds to the power supply system Bpw. One end of the switch SWB is connected to the power supply system Bpw. The other end of the switch SWB is connected to the core circuit 20 via the output terminal of the switch circuit 11. In a case where the switch SWB is in the ON state, the switch SWB transfers the voltage VIN2 to the core circuit 20. In a case where the switch SWB is in the OFF state, the switch SWB shuts off the voltage VIN2.

The switch SWC corresponds to the power supply system Cpw. One end of the switch SWC is connected to the power supply system Cpw. The other end of the switch SWC is connected to the core circuit 20 via the output terminal of the switch circuit 11. In a case where the switch SWC is in the ON state, the switch SWC transfers the voltage VIN3 to the core circuit 20. In a case where the switch SWC is in the OFF state, the switch SWC shuts off the voltage VIN3.

The ON and OFF of the switches SWA, SWB and SWC are controlled by the control circuit 15. In the description below, the switches SWA, SWB and SWC for supplying and shutting off the power supply voltages are also referred to as "power supply switches". The voltages VIN1, VIN2 and VIN3 that are applied to the power supply systems Apw, Bpw and Cpw are also referred to as "power supply voltages".

The control circuit 15 receives the power supply voltage VIN1, VIN2, VIN3 from each power supply system Apw, Bpw, Cpw. The control circuit 15 receives a control signal CNT via a signal terminal 95. The control circuit 15 supplies the control signal to the power supply switch SWA, SWB, SWC.

The control circuit 15 controls the ON and OFF of each power supply switch SWA, SWB, SWC of the switch circuit 11, based on a detection result of the power supply voltage VIN1, VIN2, VIN3 and the control signal CNT.

The power supply switching circuit 10 of the present embodiment includes, for example, in the control circuit 15, an input voltage detection circuit (also referred to simply as "voltage detection circuit") 110. The input voltage detection circuit 110 can detect the voltage VIN1, VIN2, VIN3, which is being supplied. Note that the input voltage detection circuit 110 may be provided outside the control circuit 15.

The power supply switching circuit 10 of the present embodiment executes switching of the power supply voltages VIN1, VIN2 and VIN3, which are supplied to the core circuit 20, by using one of a plurality of operation modes, based on the detection result of the supplied power supply voltage VIN1, VIN2, VIN3.

FIG. 2 is a diagram for describing the operation modes that are executed by the power supply switching circuit 10 of the present embodiment. Parts (a), (b), (c) and (d) of FIG. 2 illustrate waveform patterns of the voltages that are output from the power supply switching circuit 10 in the operation modes executed by the power supply switching circuit 10 of the present embodiment. In each of parts (a), (b), (c) and (d) of FIG. 2, the abscissa axis of a graph corresponds to time, and the ordinate axis of the graph corresponds to voltage.

In the operation mode of part (a) of FIG. 2, the power supply switching circuit 10 outputs a power supply voltage V1 of a certain power supply system in a period from time instant t1a to time instant t2a.

At time instant t2a, the power supply switching circuit 10 switches the power supply system. In a period from time instant t2a to time instant t3a, the output voltage of the power supply switching circuit 10 increases.

At time instant t3a, the power supply switching circuit 10 outputs a power supply voltage V2 of another power supply system. The power supply voltage V2 is higher than the power supply voltage V1.

For example, after outputting the power supply voltage V2 in a period from time instant t3a to time instant t4a, the power supply switching circuit 10 switches the power supply system at time instant t4a. In a period from time instant t4a to time instant t5a, the output voltage of the power supply switching circuit 10 decreases. For example, at time instant t5a, the power supply switching circuit 10 outputs the power supply voltage V1. Note that at time instant t4a and time instant t5a, switching may be made to a power supply system corresponding to a power supply voltage other than the power supply voltage V1, from the power supply system of the power supply voltage V2.

In this manner, in the operation mode of part (a) of FIG. 2, without shutting off the power supply voltage, the output voltage of the power supply switching circuit 10 is continuously (seamlessly) switched from the power supply voltage V1 to the power supply voltage V2. For example, the operation mode of part (a) of FIG. 2 is called "MBB (Make before brake) mode".

In the operation mode of part (b) of FIG. 2, the power supply switching circuit 10 outputs a power supply voltage V1 of a certain power supply system in a period from time instant t1b to time instant t2b. At time instant t2b, the power supply switching circuit 10 is electrically disconnected from the power supply system, and shuts off the supply of the power supply voltage V1. In a period from time instant t2b to time instant t3b, the output voltage of the power supply switching circuit 10 decreases.

At time instant t3b, the power supply switching circuit 10 outputs a ground voltage VGND that is lower than the power supply voltage V1. In a period from time instant t3b to time instant t4b, the power supply switching circuit 10 continues the power supply shut-off state and outputs the ground voltage VGND.

At time instant t4b, the power supply switching circuit 10 is connected to another power supply system by the switching of the power supply system. In a period from time instant t4b to time instant t5b, the output voltage of the power supply switching circuit 10 increases. At time instant t5*b*, the power supply switching circuit 10 outputs a power supply voltage V2.

For example, after outputting the power supply voltage V2 in a period from time instant t5*b* to time instant t6*b*, the power supply switching circuit 10 shuts off the supply of the power supply voltage V2 at time instant t6*b*. In a period from time instant t6*b* to time instant t7*b*, the output voltage of the power supply switching circuit 10 decreases. For example, in a period from time instant t7*b* to time instant t8*b*, the power supply switching circuit 10 outputs the ground voltage VGND.

For example, at time instant t8*b*, the power supply switching circuit 10 is connected to the power supply system of the power supply voltage V1. In a period from time instant t8*b* to time instant t9*b*, the output voltage of the power supply switching circuit 10 increases. At time instant t9*b*, the power supply switching circuit 10 outputs the power supply voltage V1. Note that at time instant t9*b*, switching may be made to a power supply system corresponding to a power supply voltage other than the power supply voltage V1, from the power supply system of the power supply voltage V2.

In this manner, in the operation mode of part (b) of FIG. 2, in a case of switching the power supply system, the supply of the power supply voltage is shut off, and the output voltage of the power supply switching circuit 10 is switched from the power supply voltage V1 to the power supply voltage V2 (or from the power supply voltage V2 to the power supply voltage V1). In the operation mode of part (b) of FIG. 2, a period in which a ground voltage is output is provided in the period between the output of the power supply voltage V1 and the output of the power supply voltage V2. For example, the second operation mode is called "BBM (Brake before make) mode".

In the operation mode of part (c) of FIG. 2, like the operation mode of part (a), the power supply switching circuit 10 outputs the power supply voltage V1 in a period from time instant t1*c* to time instant t2*c*. At time instant t2*c*, the power supply switching circuit 10 switches the power supply system. At time instant t3*c*, the power supply switching circuit 10 outputs the power supply voltage V2.

After outputting the power supply voltage V2 in a period from time instant t3*c* to time instant t4*c*, the power supply switching circuit 10 shuts off the supply of the power supply voltage V2 at time instant t4*c*. In a period from time instant t5*c* to time instant t6*c*, the power supply switching circuit 10 outputs the ground voltage VGND.

At time instant t6*c*, the power supply switching circuit 10 is connected to the power supply system, and resumes the supply of the power supply voltage. At time instant t7*c*, the power supply switching circuit 10 outputs the power supply voltage V1.

In this manner, in the operation mode of part (c) of FIG. 2, in a case of switching the low power supply voltage V1 to the high power voltage V2, the power supply system is continuously switched without shutting off the supply of the power supply voltage, and in a case of switching the high power supply voltage V2 to the low power voltage V1, the supply of the power supply voltage is shut off. For example, the third operation mode is called "MMBtoBBM mode".

In the operation mode of part (d) of FIG. 2, like the operation mode of part (b), the power supply switching circuit 10 outputs the power supply voltage V1 in a period from time instant t1*d* to time instant t2*d*. At time instant t2*d*, the power supply switching circuit 10 is electrically disconnected from the power supply system, and shuts off the supply of the power supply voltage. At time instant t3*d*, the power supply switching circuit 10 outputs the ground voltage VGND.

After outputting the ground voltage VGND in a period from time instant t3*d* to time instant t4*d*, the power supply switching circuit 10 resumes at time instant t4*d* the supply of the power supply voltage. In a period from time instant t5*d* to time instant t6*d*, the power supply switching circuit 10 outputs the power supply voltage V2.

At time instant t6*d*, the power supply switching circuit 10 switches the power supply system. At time instant t7*d*, the power supply switching circuit 10 outputs the power supply voltage V1.

In this manner, in the operation mode of part (d) of FIG. 2, in a case of switching the low power supply voltage V1 to the high power supply voltage V2, the power supply system is switched after shutting off the supply of the power supply voltage, and in a case of switching the high power supply voltage V2 to the low power supply voltage V1, the power supply system is continuously switched without shutting off the supply of the power supply voltage. For example, the fourth operation mode is called "BBMtoMMB mode".

The power supply switching circuit 10 of the present embodiment executes the switching of the power supply system by four operation modes, by an appropriate operation mode in accordance with the detection result of the power supply voltages that are input to the power supply switching circuit 10.

(a) Power Supply Switching Circuit

FIG. 3 is a schematic diagram for describing an internal configuration of the power supply switching circuit 10 of the present embodiment.

As illustrated in FIG. 3, the power supply switching circuit 10 includes, as described above, a plurality of power supply switches SW (SWA, SWB, SWC) in the switch circuit 11.

The power supply switch SWA is provided between a power supply line 190A and an output node (output terminal) NDout. One end of the power supply switch SWA is electrically connected to the power supply line 190A. The other end of the power supply switch SWA is electrically connected to the output node NDout. By the ON or OFF of the power supply switch SWA, the electrical connection or disconnection between the power supply line 190A and the output node NDout can be controlled.

The power supply switch SWB is provided between a power supply line 190B and the output node NDout. One end of the power supply switch SWB is electrically connected to the power supply line 190B. The other end of the power supply switch SWB is electrically connected to the output node NDout. By the ON or OFF of the power supply switch SWB, the electrical connection or disconnection between the power supply line 190B and the output node NDout can be controlled.

The power supply switch SWC is provided between a power supply line 190C and the output node NDout. One end of the power supply switch SWC is electrically connected to the power supply line 190C. The other end of the power supply switch SWC is electrically connected to the output node NDout. By the ON or OFF of the power supply switch SWC, the electrical connection or disconnection between the power supply line 190O and the output node NDout can be controlled.

Each of the power supply switches SW is a common-drain MOSFET. The common-drain MOSFET functioning as the power supply switch SW includes two transistors (MOSFETs) TR1 (TR1a, TR1b, TR1c) and TR2 (TR2a, TR2b, TR2c).

One end (source) of a current path of the transistor TR1 is connected to the corresponding power supply line 190 (190A, 190B, 190C). One end (source) of a current path of the transistor TR2 is connected to the output node (output terminal) NDout of the power supply switching circuit 10. The other end (drain) of the current path of the transistor TR1 is connected to the other end (drain) of the current path of the transistor TR2. A gate of the transistor TR1 and a gate of the transistor TR2 are connected to a driver circuit (also referred to as "gate driver circuit") 140. A gate signal (control signal) g1 (g1a, g1b, g1c) is supplied to a switch 145 (145a, 145b, 145c) connected to the gate of the transistor TR1. A gate signal (control signal) g2(g2a, g2b, g2c) is supplied to a switch 146 (146a, 146b, 146c) connected to the gate of the transistor TR2. The ON and OFF of the power supply switch SW including the common-drain MOSFET, and the operation timing of the common-drain MOSFET, are controlled in accordance with the gate signals g1 (g1a, g1b, g1c) and g2 (g2a, g2b, g2c).

The voltage VIN of the power supply system selected by the power supply switch SW that is in the ON state is output from the power supply switching circuit 10 as a power supply voltage (also referred to as "output voltage") VBUS that is output from the switch circuit 11.

In the power supply switching circuit 10 of the present embodiment, the control circuit 15 includes an input voltage detection circuit 110, an input logic circuit 120, a gate driver control circuit 130 and a driver circuit 140.

The input voltage detection circuit 110 is connected to the power supply lines 190A, 190B and 190C corresponding to the power supply systems Apw, Bpw and Cpw. The input voltage detection circuit 110 can detect a supply state (presence/absence of input) of the power supply voltage VIN1, VIN2, VIN3 in each power supply system Apw, Bpw, Cpw, and a relationship in magnitude between the power supply voltages VIN1, VIN2 and VIN3. The input voltage detection circuit 110 supplies a control signal MD, which is based on a detection result of the input power supply voltages VIN1, VIN2 and VIN3, to the gate driver control circuit 130. For example, the control signal MD is a signal indicating an operation mode to be executed by the power supply switching circuit 10.

The input logic circuit 120 receives various control signals EN1, EN2, EN3, and MDx included in a control signal CNT.

The control signal EN1, EN2, EN3 is a signal (enable signal) indicating a power supply system that is set in an enabled state among the power supply systems. In other words, the control signal EN(EN1, EN2, EN3) is a signal indicating the power supply voltage VIN in the enabled state. The control signal EN1 is related to an input of the power supply voltage VIN1. The control signal EN2 is related to an input of the power supply voltage VIN2. The control signal EN3 is related to an input of the power supply voltage VIN3.

The signal MDx is a signal notifying an operation mode to be executed by the power supply switching circuit 10 from the outside of the power supply switching circuit 10.

The input logic circuit 120 executes a calculation process (for example, a logical operation) using the various control signals EN and MDx that are input. The input logic circuit 120 supplies a control signal SL, which is based on a result of the calculation process, to the input voltage detection circuit 110 and the gate driver control circuit 130.

The gate driver control circuit 130 receives the control signal MD from the input voltage detection circuit 110 and the control signal SL from the input logic circuit 120. The gate driver control circuit 130 generates a control signal SG that is based on a calculation process using the control signal MD and control signal SL. The gate driver control circuit 130 delivers the control signal SG to the driver circuit 140.

The driver circuit 140 receives the control signal SG from the gate driver control circuit 130. Based on the control signal SG, the driver circuit 140 controls the operation of each power supply switch SW.

The driver circuit 140 includes a plurality of booster circuits 141 (141a, 141b, 141c) and a plurality of gate drivers 142 (142a, 142b, 142c) in association with the power supply switches SWA, SWB and SWC.

The booster circuit 141 is connected to the corresponding power supply line 190. The booster circuit 141 receives the power supply voltage VIN from the connected power supply line 190. The booster circuit 141 boosts the power supply voltage VIN in accordance with the control signal SG from the gate driver control circuit 130. The booster circuit 141 supplies a boosted voltage (for example, a driving voltage of the power supply switch SW) to the corresponding gate driver 142.

The gate driver 142 is connected to the corresponding power supply switch SW. The gate driver 142 receives the boosted voltage from the booster circuit 141. The gate driver 142 receives the control signal SG from the gate driver control circuit 130. Using the boosted voltage and the control signal SG, the gate driver 142 generates gate voltages (driving voltages). The gate driver 142 supplies the generated gate voltages to the corresponding power supply switch SW via the switches 145 (145a, 145b, 145c) and 146 (146a, 146b, 146c).

The switches 145 and 146 control the connection between the gate driver 142 and the power supply switch SW. Gate signals g1a, g1b and g1c are supplied to the switches 145a, 145b and 145c, respectively. Gate signals g2a, g2b and g2c are supplied to the switches 146a, 146b and 146c, respectively. By the gate signal g1a, g1b, g1c, g2a, g2b, g2c, the switch 145, 146 is turned on or off. By the gate signals g1a, g1b, g1c, g2a, g2b and g2c, the operation timings of different power supply switches SW are independently controlled. By the gate signals g1a, g1b, g1c, g2a, g2b and g2c, the operation timings of the transistors TR1 and TR2 in each power supply switch SW are controlled at the same time.

The protection circuit 150 is connected to, for example, the gate driver control circuit 130. The protection circuit 150 protects the gate driver control circuit 130. For example, the protection circuit 150 includes an ESD protection circuit or the like.

(a-1) Input Voltage Detection Circuit

Referring to FIG. 4 and FIG. 5, a description is given of an internal configuration of the input voltage detection circuit 110 in the power supply switching circuit 10 of the present embodiment.

FIG. 4 is a circuit diagram illustrating an example of the internal configuration of the input voltage detection circuit 110 in the power supply switching circuit 10 of the present embodiment.

The input voltage detection circuit 110 receives the power supply voltage VIN(VIN1, VIN2, VIN3) via a resistor circuit (voltage division circuit) 270 (270a, 270b, 270c).

The resistor circuit 270a includes a plurality of resistors 271a and 272a. One end of the resistor 271a receives the power supply voltage VIN1. The other end of the resistor 271a is connected to one end of the resistor 272a via a connection node ND1. The other end of the resistor 272*a* is grounded. The resistor circuit 270*a* divides the power supply voltage VIN1. For example, the resistor circuit 270*a* outputs a voltage of about 0.05×VIN1 from the connection node ND1.

The resistor circuit 270*b* includes a plurality of resistors 271*b* and 272*b*. One end of the resistor 271*b* receives the power supply voltage VIN2. The other end of the resistor 271*b* is connected to one end of the resistor 272*b* via a connection node ND2. The other end of the resistor 272*b* is grounded. The resistor circuit 270*b* divides the power supply voltage VIN2. For example, the resistor circuit 270*b* outputs a voltage of about 0.05×VIN2 from the connection node ND2.

The resistor circuit 270*c* includes a plurality of resistors 271*c* and 272*c*. One end of the resistor 271*c* receives the power supply voltage VIN3. The other end of the resistor 271*c* is connected to one end of the resistor 272*c* via a connection node ND3. The other end of the resistor 272*c* is grounded. The resistor circuit 270*c* divides the power supply voltage VIN3. For example, the resistor circuit 270*c* outputs a voltage of about 0.05×VIN3 from the connection node ND3.

The input voltage detection circuit 110 includes a plurality of operational amplifiers 200 (200A, 200B, 200C). The operational amplifier 200 receives divided power supply voltages VIN from two corresponding resistor circuits 270 of the three resistor circuits 270. The operational amplifier 200 functions as a comparator.

The operational amplifier 200A corresponds to the resistor circuit 270*a* and resistor circuit 270*b*. The operational amplifier 200A is related to the power supply voltage VIN1 and power supply voltage VIN2. One input terminal (for example, an inversion input terminal) of the operational amplifier 200A is connected to the connection node ND1 of the resistor circuit 270*a*. The other input terminal (for example, a noninversion input terminal) of the operational amplifier 200A is connected to the connection node ND2 of the resistor circuit 270*b*. The operational amplifier 200A receives the divided voltage of the power supply voltage VIN1 by the one input terminal, and receives the divided voltage of the power supply voltage VIN2 by the other input terminal. The operational amplifier 200A outputs an output signal Cmpout1 indicating a comparison result of the power supply voltage VIN1 and power supply voltage VIN2. Based on the comparison result of the power supply voltage VIN1 and power supply voltage VIN2, the output signal Cmpout1 can take a signal level of "H" level or "L" level. The output signal Cmpout1 is supplied to a control circuit 250 (to be described later).

The operational amplifier 200B corresponds to the resistor circuit 270*a* and resistor circuit 270*c*. The operational amplifier 200B is related to the power supply voltage VIN1 and power supply voltage VIN3. One input terminal (for example, an inversion input terminal) of the operational amplifier 200B is connected to the connection node ND1 of the resistor circuit 270*a*. The other input terminal (for example, a noninversion input terminal) of the operational amplifier 200B is connected to the connection node ND3 of the resistor circuit 270*c*. The operational amplifier 200B receives the divided voltage of the power supply voltage VIN1 by the one input terminal, and receives the divided voltage of the power supply voltage VIN3 by the other input terminal. The operational amplifier 200B outputs an output signal Cmpout2 indicating a comparison result of the power supply voltage VIN1 and power supply voltage VIN3. Based on the comparison result of the power supply voltage VIN1 and power supply voltage VIN3, the output signal Cmpout2 can take a signal level of "H" level or "L" level. The output signal Cmpout2 is supplied to the control circuit 250 (to be described later).

The operational amplifier 200C corresponds to the resistor circuit 270*b* and resistor circuit 270*c*. The operational amplifier 200C is related to the power supply voltage VIN2 and power supply voltage VIN3. One input terminal (for example, an inversion input terminal) of the operational amplifier 200C is connected to the connection node ND2 of the resistor circuit 270*b*. The other input terminal (for example, a noninversion input terminal) of the operational amplifier 200C is connected to the connection node ND3 of the resistor circuit 270*c*. The operational amplifier 200C receives the divided voltage of the power supply voltage VIN2 by the one input terminal, and receives the divided voltage of the power supply voltage VIN3 by the other input terminal. The operational amplifier 200C outputs an output signal Cmpout3 indicating a comparison result of the power supply voltage VIN2 and power supply voltage VIN3. Based on the comparison result of the power supply voltage VIN2 and power supply voltage VIN3, the output signal Cmpout3 can take a signal level of "H" level or "L" level. The output signal Cmpout3 is supplied to the control circuit 250 (to be described later).

The input voltage detection circuit 110 includes a plurality of switches 211, 212, 213 and 214.

One end of the switch 211 is connected to the connection node ND1 of the resistor circuit 270*a*. The other end of the switch 211 is connected to a switch SWHa and a switch SWLb. One end of the switch 212 is connected to the connection node ND2 of the resistor circuit 270*b*. The other end of the switch 212 is connected to a switch SWHb and a switch SWLa. One end of the switch 213 is connected to the connection node ND3 of the resistor circuit 270*c*. The other end of the switch 213 is connected to the switch SWHa and the switch SWLb. One end of the switch 214 is connected to the connection node ND3 of the resistor circuit 270*c*. The other end of the switch 214 is connected to the switch SWHb and the switch SWLa.

The ON and OFF of the switches 211, 212, 213 and 214 are controlled based on control signals SW1, SW2, SW3 and SW4 from the input logic circuit 120. The ON/OFF of the switch 211 is controlled by the control signal SW1. The ON/OFF of the switch 212 is controlled by the control signal SW2. The ON/OFF of the switch 213 is controlled by the control signal SW3. The ON/OFF of the switch 214 is controlled by the control signal SW4.

In a case where the switch 211 is set in the ON state, the switch 212 or switch 214 is set in the ON state and the switch 213 is set in the OFF state. In a case where the switch 212 is set in the ON state, the switch 211 or switch 213 is set in the ON state and the switch 214 is set in the OFF state. In a case where the switch 213 is set in the ON state, the switch 212 is set in the ON state and the switches 211 and 214 are set in the OFF state. In a case where the switch 214 is set in the ON state, the switch 211 is set in the ON state and the switches 212 and 213 are set in the OFF state.

The signal levels of the control signals SW1, SW2, SW3 and SW4 are set in accordance with the control signals EN1, EN2 and EN3 that are supplied to the input logic circuit 120.

The input voltage detection circuit 110 includes a plurality of operational amplifiers 220 (220H, 220L). The operational amplifier 220 functions as a subtraction circuit. The operational amplifier 220 functioning as the subtraction circuit executes a subtraction process for supplied power supply voltages.

One input terminal (for example, an inversion input terminal) of the operational amplifier 220H is connected to an output terminal of the operational amplifier 220H via a resistor 282H. The other input terminal (for example, a noninversion input terminal) of the operational amplifier 220H is connected to a ground terminal via a resistor 281H. The one input terminal of the operational amplifier 220H is connected to the connection node ND1 of the resistor circuit 270a via a resistor 280a, switch SWHa and switch 211. The one input terminal of the operational amplifier 220H is connected to the connection node ND3 of the resistor circuit 270c via the resistor 280a, switch SWHa and switch 213. The other input terminal of the operational amplifier 220H is connected to the connection node ND2 of the resistor circuit 270b via a resistor 280b, switch SWHb and switch 212. The other input terminal of the operational amplifier 220H is connected to the connection node ND3 of the resistor circuit 270c via the resistor 280b, switch SWHb and switch 214.

In a case where the switch SWHa, SWHb is set in the ON state, the one input terminal of the operational amplifier 220H receives the divided voltage of the power supply voltage VIN3 via the switch 213 that is in the ON state, or receives the divided voltage of the power supply voltage VIN1 via the switch 211 that is in the ON state. In a case where the switch SWHa, SWHb is set in the ON state, the other input terminal of the operational amplifier 220H receives the divided voltage of the power supply voltage VIN2 via the switch 212 that is in the ON state, or receives the divided voltage of the power supply voltage VIN3 via the switch 214 that is in the ON state. The operational amplifier 220H outputs an output signal VOUT1 in accordance with the two supplied voltages.

One input terminal (for example, an inversion input terminal) of the operational amplifier 220L is connected to an output terminal of the operational amplifier 220L via a resistor 282L. The other input terminal (for example, a noninversion input terminal) of the operational amplifier 220L is connected to a ground terminal via a resistor 281L. The one input terminal of the operational amplifier 220L is connected to the connection node ND2 of the resistor circuit 270b via a resistor 283a, switch SWLa and switch 212. The one input terminal of the operational amplifier 220L is connected to the connection node ND3 of the resistor circuit 270c via the resistor 283a, switch SWLa and switch 214. The other input terminal of the operational amplifier 220L is connected to the connection node ND1 of the resistor circuit 270a via a resistor 283b, switch SWLb and switch 211. The other input terminal of the operational amplifier 220L is connected to the connection node ND3 of the resistor circuit 270c via the resistor 283b, switch SWLb and switch 213.

In a case where the switch SWLa, SWLb is set in the ON state, the one input terminal of the operational amplifier 220L receives the divided voltage of the power supply voltage VIN2 via the switch 212 that is in the ON state, or receives the divided voltage of the power supply voltage VIN3 via the switch 214 that is in the ON state. In a case where the switch SWLa, SWLb is set in the ON state, the other input terminal of the operational amplifier 220L receives the divided voltage of the power supply voltage VIN1 via the switch 211 that is in the ON state, or receives the divided voltage of the power supply voltage VIN3 via the switch 213 that is in the ON state. The operational amplifier 220L outputs an output signal VOUT2 in accordance with the two supplied voltages.

One of the switch SWH (SWHa, SWHb) and the switch SWL (SWLa, SWLb) is set in the ON state in accordance with a control signal SQ from the control circuit 250. One of the two operational amplifiers 220H and 220L is activated in accordance with the ON and OFF of the switch SWH, SWL. The activated operational amplifier 220 (220H, 220L) receives the power supply voltage VIN.

The ON and OFF of the switch SWH, SWL is controlled by the control circuit 250.

FIG. 5 is a circuit diagram illustrating an internal configuration the control circuit 250.

As illustrated in FIG. 5, the control circuit 250 includes AND gates 701, 702 and 703, switches 704, 705 and 706, and an OR gate 710.

The AND gate 701 receives a control signal SW1 by one input terminal. The AND gate 701 receives a control signal SW2 by the other input terminal. An output terminal of the AND gate 701 is connected to a control terminal of the switch 704. The AND gate 701 executes a logical product operation (AND operation) of the control signal SW1 and control signal SW2. The AND gate 701 supplies a signal indicating a result of the AND operation to the switch 704 as a control signal.

The AND gate 702 receives the control signal Sw1 by one input terminal. The AND gate 702 receives a control signal SW4 by the other input terminal. An output terminal of the AND gate 702 is connected to a control terminal of the switch 705. The AND gate 702 executes an AND operation of the control signal SW1 and control signal SW4. The AND gate 702 supplies a signal indicating a result of the AND operation to the switch 705 as a control signal.

The AND gate 703 receives the control signal SW2 by one input terminal. The AND gate 703 receives a control signal SW3 by the other input terminal. An output terminal of the AND gate 703 is connected to a control terminal of the switch 706. The AND gate 703 executes an AND operation of the control signal SW2 and control signal SW3. The AND gate 703 supplies a signal indicating a result of the AND operation to the switch 706 as a control signal.

One input terminal of the switch 704 receives a signal Cmpout1. The other input terminal of the switch 704 is connected to a first input terminal of the OR gate 710. A control terminal of the switch 704 receives the output signal of the AND gate 701. The switch 704 is turned on or off in accordance with the output signal (the result of the AND operation of the control signals SW1 and SW2) of the AND gate 701. The switch 704 in the ON state supplies the signal Cmpout1 to the OR gate 710.

One input terminal of the switch 705 receives a signal Cmpout2. The other input terminal of the switch 705 is connected to a second input terminal of the OR gate 710. A control terminal of the switch 705 receives the output signal of the AND gate 702. The switch 705 is turned on or off in accordance with the output signal (the result of the AND operation of the control signals SW1 and SW4) of the AND gate 702. The switch 705 in the ON state supplies the signal Cmpout2 to the OR gate 710.

One input terminal of the switch 706 receives a signal Cmpout3. The other input terminal of the switch 706 is connected to a third input terminal of the OR gate 710. A control terminal of the switch 706 receives the output signal of the AND gate 703. The switch 706 is turned on or off in accordance with the output signal (the result of the AND operation of the control signals SW2 and SW3) of the AND gate 703. The switch 706 in the ON state supplies the signal Cmpout3 to the OR gate 710.

The OR gate 710 receives the signal Cmpout1 from the switch 704, the signal Cmpout2 from the switch 705, and the signal Cmpout3 from the switch 706. The OR gate 710 executes a logical sum operation (OR operation) of the signals Cmpout1, Cmpout2 and Cmpout3. The OR gate 710 supplies a signal SQ indicating a result of the OR operation to the control terminal of the switch SWH, SWL.

Thereby, the switch SWH, SWL is turned on or off in accordance with the control signals SW1, SW2, SW3 and SW4 and the signals Cmpout1, Cmpout2 and Cmpout3.

Referring back to FIG. 4, the input voltage detection circuit 110 includes operational amplifiers 230 (230A, 230B) and an OR gate 240. The operational amplifier 230 functions as a comparator.

One input terminal of the operational amplifier 230A is connected to an output terminal of the operational amplifier 220H. The other input terminal of the operational amplifier 230A is connected to a resistor circuit 290*a*. The resistor circuit 290*a* includes a resistor 291*a* and a resistor 292*a*. One end of the resistor 291*a* is connected to a terminal (power supply terminal VBG) to which a bandgap voltage VBG is applied, and the other end of the resistor 291*a* is connected to one end of the resistor 292*a* via a connection node Na. The other end of the resistor 292*a* is connected to a ground terminal. The resistor circuit 290*a* divides the bandgap voltage VBG, and outputs a reference voltage VREF from the connection node Na. The connection node Na of the two resistors 291*a* and 292*a* is connected to the other input terminal of the operational amplifier 230A. An output terminal of the operational amplifier 230A is connected to one input terminal of the OR gate 240. The operational amplifier 230A compares a voltage VOUT1 from the operational amplifier 220H and the reference voltage VREF from the resistor circuit 290*a*. The operational amplifier 230A outputs to the OR gate 240 a signal of "H" level or "L" level corresponding to the comparison result.

One input terminal of the operational amplifier 230B is connected to an output terminal of the operational amplifier 220L. The other input terminal of the operational amplifier 230B is connected to a resistor circuit 290*b*. The resistor circuit 290*b* includes a resistor 291*b* and a resistor 292*b*. One end of the resistor 291*b* is connected to a power supply terminal VBG, and the other end of the resistor 291*b* is connected to one end of the resistor 292*b* via a connection node Nb. The other end of the resistor 292*b* is connected to a ground terminal. The connection node Nb of the two resistors 291*b* and 292*b* is connected to the other input terminal of the operational amplifier 230B. The resistor circuit 290*b* outputs a reference voltage VREF from the connection node Nb. An output terminal of the operational amplifier 230B is connected to the other input terminal of the OR gate 240. The operational amplifier 230B compares a voltage VOUT2 from the operational amplifier 220L and the reference voltage VREF from the resistor circuit 290*b*. The operational amplifier 230B outputs to the OR gate 240 a signal of "H" level or "L" level corresponding to the comparison result.

One input terminal of the OR gate 240 is connected to the output terminal of the operational amplifier 230A. The other input terminal of the OR gate 240 is connected to the output terminal of the operational amplifier 230B. An output terminal of the OR gate 240 is connected to the gate driver control circuit 130.

The OR gate 240 executes an OR operation between the output signal of the operational amplifier 230A, which corresponds to the result of the calculation process of the subtraction circuit 220H, and the output signal of the operational amplifier 230B, which corresponds to the result of the calculation process of the subtraction circuit 220L. The OR gate 240 outputs a mode signal MD indicating a result of the OR operation, to the gate driver control circuit 130. The mode signal MD can take a signal level of "H" level or "L" level. For example, the mode signal MD of "H(1)" level indicates the MBB mode. For example, the mode signal MD of "L(0)" level indicates the BBM mode.

The gate driver control circuit 130 controls the gate signals g1*a*, g2*a*, g1*b*, g2*b*, g1*c* and g2*c* for controlling the power supply switches SWA, SWB and SWC, based on the mode signal MD from the input voltage detection circuit 110 and the control signals EN1, EN2 and EN3.

In this manner, in the power supply switching circuit 10 of the present embodiment, the input voltage detection circuit 110 detects the input power supply voltage VIN. Based on the input power supply voltage VIN, the input voltage detection circuit 110 determines the mode signal MD indicating the operation mode to be executed by the power supply switching circuit 10.

Thereby, the power supply switching circuit 10 of the present embodiment can automatically switch the power supply system (the power supply voltage to be output) by the appropriate operation mode.

Note that there is a case where the switching of the power supply system is controlled by an external mode signal MDX that is supplied from the outside of the power supply switching circuit 10.

(a-2) Input Logic Circuit

Referring to FIG. 6, a description is given of an internal configuration of the input logic circuit 120 in the power supply switching circuit 10 of the present embodiment.

FIG. 6 is a block diagram illustrating an example of the internal configuration of the input logic circuit 120 in the power supply switching circuit 10 of the present embodiment.

As illustrated in FIG. 6, the input logic circuit 120 includes a determination circuit 40 and a logic circuit 50.

The determination circuit 40 receives the control signal EN(EN1, EN2, EN3). Based on a determination result of the control signal EN, the determination circuit 40 outputs a control signal XA, XB, XC to the logic circuit 50. The determination circuit 40 includes three circuit blocks 41A, 41B and 41C. Based on the supplied control signal EN, the circuit block 41A outputs the control signal XA to the logic circuit 50. Based on the supplied control signal EN, the circuit block 41B outputs the control signal XB to the logic circuit 50. Based on the supplied control signal EN, the circuit block 41C outputs the control signal XC to the logic circuit 50.

Based on the control signals XA, XB and XC from the circuit blocks 41A, 41B and 41C, the logic circuit 50 controls signal levels of the control signals SW1, SW2, SW3 and SW4.

The control signals SW1, SW2, SW3 and SW4 are supplied to the switches 211, 212, 213 and 214 of the input voltage detection circuit 110. The control signal SW1 controls the ON and OFF of the switch 211. The control signal SW2 controls the ON and OFF of the switch 212. The control signal SW3 controls the ON and OFF of the switch 213. The control signal SW4 controls the ON and OFF of the switch 214.

Figure 7:
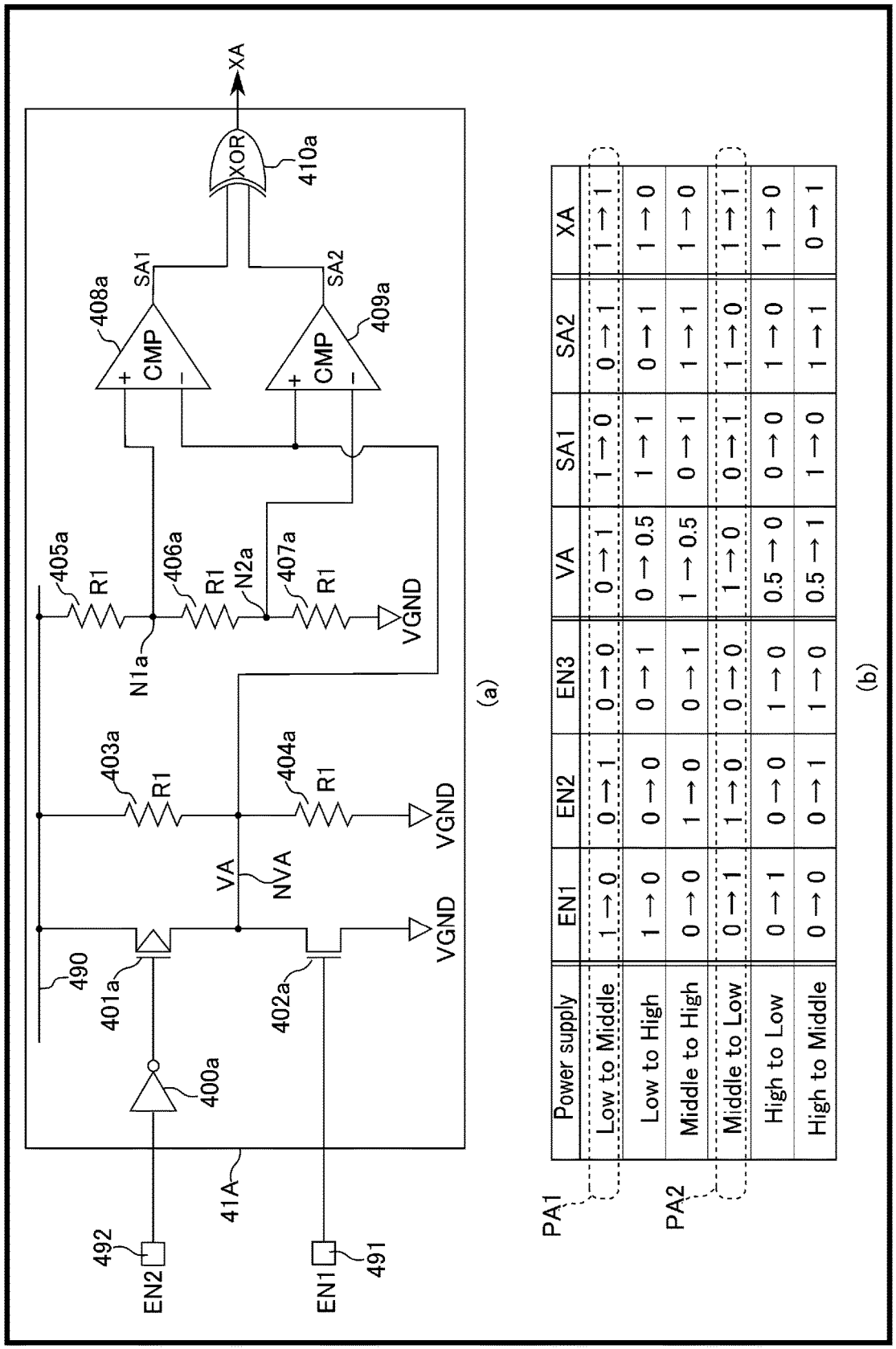
FIG. 7 is a diagram illustrating a configuration example of the input logic circuit of the semiconductor circuit of the embodiment.

FIG. 7 is a schematic view for describing a configuration example and an operation of the circuit block 41A in the determination circuit 40 of FIG. 6.

Part (a) of FIG. 7 is a circuit diagram illustrating an internal configuration of the circuit block 41A in the determination circuit 40.

As illustrated in part (a) of FIG. 7, the circuit block 41A includes an inverter 400a, transistors 401a and 402a, resistors 403a, 404a, 405a, 406a and 407a, operational amplifiers 408a and 409a, and a logic gate 410a.

An input terminal of the inverter (NOT gate) 400a is connected to a terminal 492 to which the control signal EN2 is supplied. An output terminal of the inverter 400a is connected to a gate of the transistor 401a. The inverter 400a outputs an inversion signal of the control signal EN2.

The transistor 401a is a P-type field-effect transistor. One end of a current path of the transistor 401a is connected to an internal power supply line 490 to which an internal power supply voltage (for example, a voltage VDD) is applied. The other end of the current path of the transistor 401a is connected to an internal node NVA. A gate of the transistor 401a is connected to the output terminal of the inverter 400a. The transistor 401a is turned on or off in accordance with the inversion signal of the control signal EN2.

The transistor 402a is an N-type field-effect transistor. One end of a current path of the transistor 402a is connected to the internal node NVA. The other end of the current path of the transistor 402a is connected to a ground terminal. A gate of the transistor 402a is connected to a terminal 491 to which the control signal EN1 is supplied. The transistor 402a is turned on or off in accordance with the control signal EN1.

Each of the resistors 403a, 404a, 405a, 406a and 407a has a resistance value R1.

One end of the resistor 403a is connected to the internal power supply line 490. The other end of the resistor 403a is connected to the internal node NVA. One end of the resistor 404a is connected to the internal node NVA. The other end of the resistor 404a is connected to a ground terminal. One end of the resistor 405a is connected to the internal power supply line 490. The other end of the resistor 405a is connected to an internal node N1a. One end of the resistor 406a is connected to the internal node N1a. The other end of the resistor 406a is connected to an internal node N2a. One end of the resistor 407a is connected to the internal node N2a. The other end of the resistor 407a is connected to a ground terminal.

The operational amplifier 408a, 409a functions as a comparator.

One input terminal (for example, a noninversion input terminal) of the operational amplifier 408a is connected to the internal node N1a. The other input terminal (for example, an inversion input terminal) of the operational amplifier 408a is connected to the internal node NVA. An output terminal of the operational amplifier 408a is connected to one input terminal of the logic gate 410a. The operational amplifier 408a outputs to the logic gate 410a a signal SA1 corresponding to a comparison result between a voltage VA of the internal node NVA and a voltage of the internal node N1a.

One input terminal (for example, a noninversion input terminal) of the operational amplifier 409a is connected to the internal node NVA. The other input terminal (for example, an inversion input terminal) of the operational amplifier 409a is connected to the internal node N2a. An output terminal of the operational amplifier 409a is connected to the other input terminal of the logic gate 410a. The operational amplifier 409a outputs to the logic gate 410a a signal SA2 corresponding to a comparison result between a voltage of the internal node N2a and the voltage VA of the internal node NVA.

Note that the potential of the internal node N1a is about 0.66 times the internal power supply voltage. The potential of the internal node N2a is about 0.33 times the internal power supply voltage.

The logic gate 410a is an XOR gate. One input terminal of the XOR gate 410a is connected to the output terminal of the operational amplifier 408a. The other input terminal of the XOR gate 410a is connected to the output terminal of the operational amplifier 409a. An output terminal of the XOR gate 410a is connected to the logic circuit 50.

The XOR gate 410a executes an exclusive logical sum operation (XOR operation) between the signal SA1 from the operational amplifier 408a and the signal SA2 from the operational amplifier 409a. The XOR gate 410a outputs a signal XA indicating a result of the XOR operation to the logic circuit 50.

The circuit block 41A executes determination relating to the switching between the power supply systems of the power supply voltage VIN1 and power supply voltage VIN2, among the three power supply voltages VIN1, VIN2 and VIN3. For example, the power supply voltage VIN1 is lower than the power supply voltage VIN2 (and power supply voltage VIN3). For example, the power supply voltage VIN2 is higher than the power supply voltage VIN1 and is lower than the power supply voltage VIN3.

The control signal EN1 is related to the input of the power supply voltage VIN1. The control signal EN2 is related to the input of the power supply voltage VIN2.

Part (b) of FIG. 7 is a view for describing an operation of the circuit block 41A of part (a) of FIG. 7.

In a case of switching the power supply voltage between the power supply voltage (hereinafter also referred to as "low power supply voltage") VIN1 that is a low voltage and the power supply voltage (also referred to as "middle power supply voltage") VIN2 that is a middle voltage, the circuit block 41A keeps the signal level of the control signal XA at "1 (H)" level in accordance with the detection of the input of the power supply voltage VIN1 and/or the input of the power supply voltage VIN2.

For example, as illustrated in a pattern PA1 of part (b) of FIG. 7, in a case where the power supply voltage is switched from the low power supply voltage VIN1 to the middle power supply voltage VIN2, the signal level of the control signal EN1 changes from "1" level to "0 (L)" level, and the signal level of the control signal EN2 changes from "0" level to "1" level, in accordance with the input of the power supply voltage VIN2. Note that the signal level of the control signal EN3 is kept at "0" level.

In a case where the signal level of the control signal EN1 changed from "1" level to "0" level, the transistor 402a is turned off. In a case where the signal level of the control signal EN2 changed from "0" level to "1" level, the transistor 401a is turned on. As a result, the voltage VA of the internal node NVA changes from "0" level to "1" level. The voltage VA becomes higher than the voltage of the internal node N1a, N2a.

In accordance with the change of the voltage VA of the internal node NVA, the output signal SA1 of the operational amplifier 408a changes from "1" level to "0" level. Along with this, the output signal SA2 of the operational amplifier 409a changes from "0" level to "1" level.

The XOR gate 410a receives the signal SA1 that changes from "1" level to "0" level, and the signal SA2 that changes from "0" level to "1" level.

In a case where the XOR gate 410a receives the signal SA1 of "1" level and the signal SA2 of "0" level, the control signal XA of the XOR gate 410a is at "1" level. In accordance with the transition of the signal SAL, SA2, if the XOR gate 410a receives the signal SAL of "0" level and the signal SA2 of "1" level, the control signal XA of the XOR gate 410a is at "1" level.

In this manner, at the timing of the switching from the low power supply voltage VIN1 to the middle power supply voltage VIN2, the control signal XA of the circuit block 41A is kept at "1" level.

As illustrated in a pattern PA2 of part (b) of FIG. 7, in a case where the power supply voltage is switched from the middle power supply voltage VIN2 to the low power supply voltage VIN1, the signal level of the control signal EN1 changes from "0" level to "1" level, and the signal level of the control signal EN2 changes from "1" level to "0" level, in accordance with the input of the power supply voltage VIN1.

In a case where the signal level of the control signal EN1 changed from "0" level to "1" level, the transistor 402a is turned on. In a case where the signal level of the control signal EN2 changed from "1" level to "0" level, the transistor 401a is turned off. As a result, the voltage VA of the internal node NVA changes from "1" level to "0" level. The voltage VA becomes lower than the voltage of the internal node N1a, N2a.

In accordance with the change of the voltage VA of the internal node NVA, the output signal SA1 of the operational amplifier 408a changes from "0" level to "1" level. Along with this, the output signal SA2 of the operational amplifier 409a changes from "1" level to "0" level.

The XOR gate 410a receives the signal SA1 that changes from "0" level to "1" level, and the signal SA2 that changes from "1" level to "0" level.

In a case where the XOR gate 410a receives the signal SA1 of "0" level and the signal SA2 of "1" level, the control signal XA of the XOR gate 410a is at "1" level. In accordance with the transition of the signal SA1, SA2, if the XOR gate 410a receives the signal SA1 of "1" level and the signal SA2 of "0" level, the control signal XA of the XOR gate 410a is at "1" level.

In this manner, at the timing of the switching from the middle power supply voltage VIN2 to the low power supply voltage VIN1, the control signal XA of the circuit block 41A is kept at "1" level.

In cases other than the switching of the power supply voltage between the power supply voltage VIN1 and the power supply voltage VIN2, the transition pattern of the control signal XA of the XOR gate 410a becomes a transition pattern from "1" level to "0" level, or a transition pattern from "0" level to "1" level.

In this manner, in a case where the transition occurs in the signal levels of the control signal EN1 and control signal EN2, the circuit block 41A continues the output of the signal XA of "1" level.

Accordingly, the circuit block 41A can specify the switching from the low power supply voltage VIN1 to middle power supply voltage VIN2, or the switching from the middle power supply voltage VIN2 to low power supply voltage VIN1.

For example, in a case where the signal level of the signal XA is kept at "1" level during the period of the switching between the low power supply voltage VIN1 and the middle power supply voltage VIN2, the power supply switching circuit 10 operates in the MBB mode.

Figure 8:
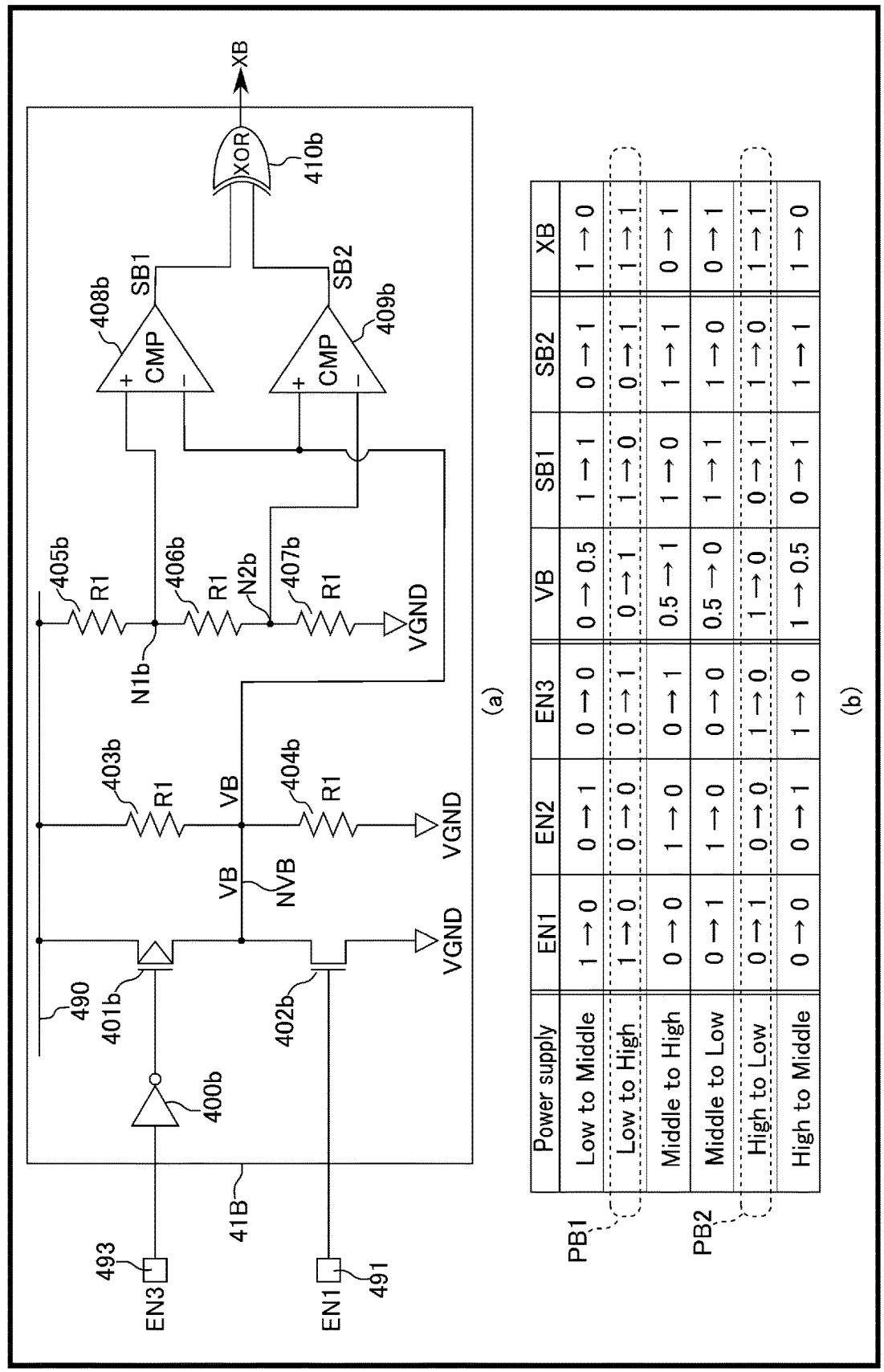
FIG. 8 is a diagram illustrating a configuration example of the input logic circuit of the semiconductor circuit of the embodiment.

FIG. 8 is a schematic view for describing a configuration example and an operation of the circuit block 41B in the determination circuit 40 of FIG. 6.

Part (a) of FIG. 8 is a circuit diagram illustrating an internal configuration of the circuit block 41B in the determination circuit 40.

As illustrated in part (a) of FIG. 8, the circuit block 41B includes an inverter 400b, transistors 401b and 402b, resistors 403b, 404b, 405b, 406b and 407b, operational amplifiers 408b and 409b, and a logic gate (XOR gate) 410b.

In the circuit block 41B, the connection relations between the structural elements 400b, 401b, 410b are substantially the same as in the circuit block 41A of part (a) of FIG. 7. However, in the following points, the configuration of the circuit block 41B differs from the configuration of the circuit block 41A.

The inverter 400b receives the control signal EN3 that is supplied to a terminal 493. The inverter 400b outputs an inversion signal of the control signal EN3 to a gate of the P-type transistor 401b.

The operational amplifier 408b outputs a signal SB1 to one input terminal of the XOR gate 410b, in accordance with the relationship in magnitude between the voltage of an internal node N1b and a voltage VB of an internal node NVB.

The operational amplifier 409b outputs a signal SB2 to the other input terminal of the XOR gate 410b, in accordance with the relationship in magnitude between the voltage of an internal node N2b and a voltage VB of an internal node NVB.

The XOR gate 410b outputs a signal XB indicating a result of an XOR operation of the signals SB1 and SB2 to the logic circuit 50.

The circuit block 41B executes determination relating to the switching between the power supply systems of the low power supply voltage VIN1 and the power supply voltage (hereinafter also referred to as "high power supply voltage") VIN3 that is a high voltage, among the three power supply voltages VIN1, VIN2 and VIN3. The control signal EN3 is related to the input of the power supply voltage VIN3.

Part (b) of FIG. 8 is a view for describing an operation of the circuit block 41B of part (a) of FIG. 8.

In a case of switching the power supply voltage between the power supply voltage VIN1 that is a low voltage and the power supply voltage VIN3 that is a high voltage, the circuit block 41B keeps the signal level of the control signal XB at "1" level in accordance with the detection of the input of the power supply voltage VIN1 and/or the input of the power supply voltage VIN3.

For example, as illustrated in a pattern PB1 of part (b) of FIG. 8, in a case where the power supply voltage is switched from the low power supply voltage VIN1 to the high power supply voltage VIN3, the signal level of the control signal EN1 changes from "1" level to "0" level, and the signal level of the control signal EN3 changes from "0" level to "1" level, in accordance with the input of the power supply voltage VIN3. Note that the signal level of the control signal EN2 is kept at "0" level.

In a case where the signal level of the control signal EN1 changed from "1" level to "0" level, the transistor 402b is turned off. In a case where the signal level of the control signal EN3 changed from "0" level to "1" level, the transistor 401b is turned on. As a result, the voltage VB of the internal node NVB changes from "0" level to "1" level. The voltage VB becomes higher than the voltage of the internal node N1b, N2b.

In accordance with the change of the voltage VB of the internal node NVB, the output signal SB1 of the operational amplifier 408b changes from "1" level to "0" level. Along with this, the output signal SB2 of the operational amplifier 409b changes from "0" level to "1" level.

The XOR gate 410b receives the signal SB1 that changes from "1" level to "0" level, and the signal SB2 that changes from "0" level to "1" level.

In a case where the XOR gate 410b receives the signal SB1 of "1" level and the signal SB2 of "0" level, the control signal XB of the XOR gate 410b is at "1" level. In accordance with the transition of the signal SB1, SB2, if the XOR gate 410b receives the signal SB1 of "0" level and the signal SB2 of "1" level, the control signal XB of the XOR gate 410b is at "1" level.

In this manner, at the timing of the switching from the low power supply voltage VIN1 to the high power supply voltage VIN3, the control signal XB of the circuit block 41B is kept at "1" level.

As illustrated in a pattern PB2 of part (b) of FIG. 8, in a case where the power supply voltage is switched from the high power supply voltage VIN3 to the low power supply voltage VIN1, the signal level of the control signal EN1 changes from "0" level to "1" level, and the signal level of the control signal EN3 changes from "1" level to "0" level, in accordance with the input of the power supply voltage VIN1.

In a case where the signal level of the control signal EN1 changed from "0" level to "1" level, the transistor 402b is turned on. In a case where the signal level of the control signal EN3 changed from "1" level to "0" level, the transistor 401b is turned off. As a result, the voltage VB of the internal node NVB changes from "1" level to "0" level. The voltage VB becomes lower than the voltage of the internal node N1b, N2b.

In accordance with the change of the voltage VB of the internal node NVB, the output signal SB1 of the operational amplifier 408b changes from "0" level to "1" level. Along with this, the output signal SB2 of the operational amplifier 409b changes from "1" level to "0" level.

The XOR gate 410b receives the signal SB1 that changes from "0" level to "1" level, and the signal SB2 that changes from "1" level to "0" level.

In a case where the XOR gate 410b receives the signal SB1 of "0" level and the signal SB2 of "1" level, the control signal XB of the XOR gate 410b is at "1" level. In accordance with the transition of the signal SB1, SB2, if the XOR gate 410b receives the signal SB1 of "1" level and the signal SB2 of "0" level, the control signal XB of the XOR gate 410b is at "1" level.

In this manner, at the timing of the switching from the high power supply voltage VIN3 to the low power supply voltage VIN1, the control signal XB of the circuit block 41B is kept at "1" level.

In cases other than the switching of the power supply voltage between the power supply voltage VIN1 and the power supply voltage VIN3, the transition pattern of the control signal XB of the XOR gate 410b becomes a transition pattern from "1" level to "0" level, or a transition pattern from "0" level to "1" level.

In this manner, in a case where the transition occurs in the signal levels of the control signal EN1 and control signal EN3, the circuit block 41B continues the output of the signal XB of "1" level.

Accordingly, the circuit block 41B can specify the switching from the low power supply voltage VIN1 to high power supply voltage VIN3, or the switching from the high power supply voltage VIN3 to low power supply voltage VIN1.

Figure 9:
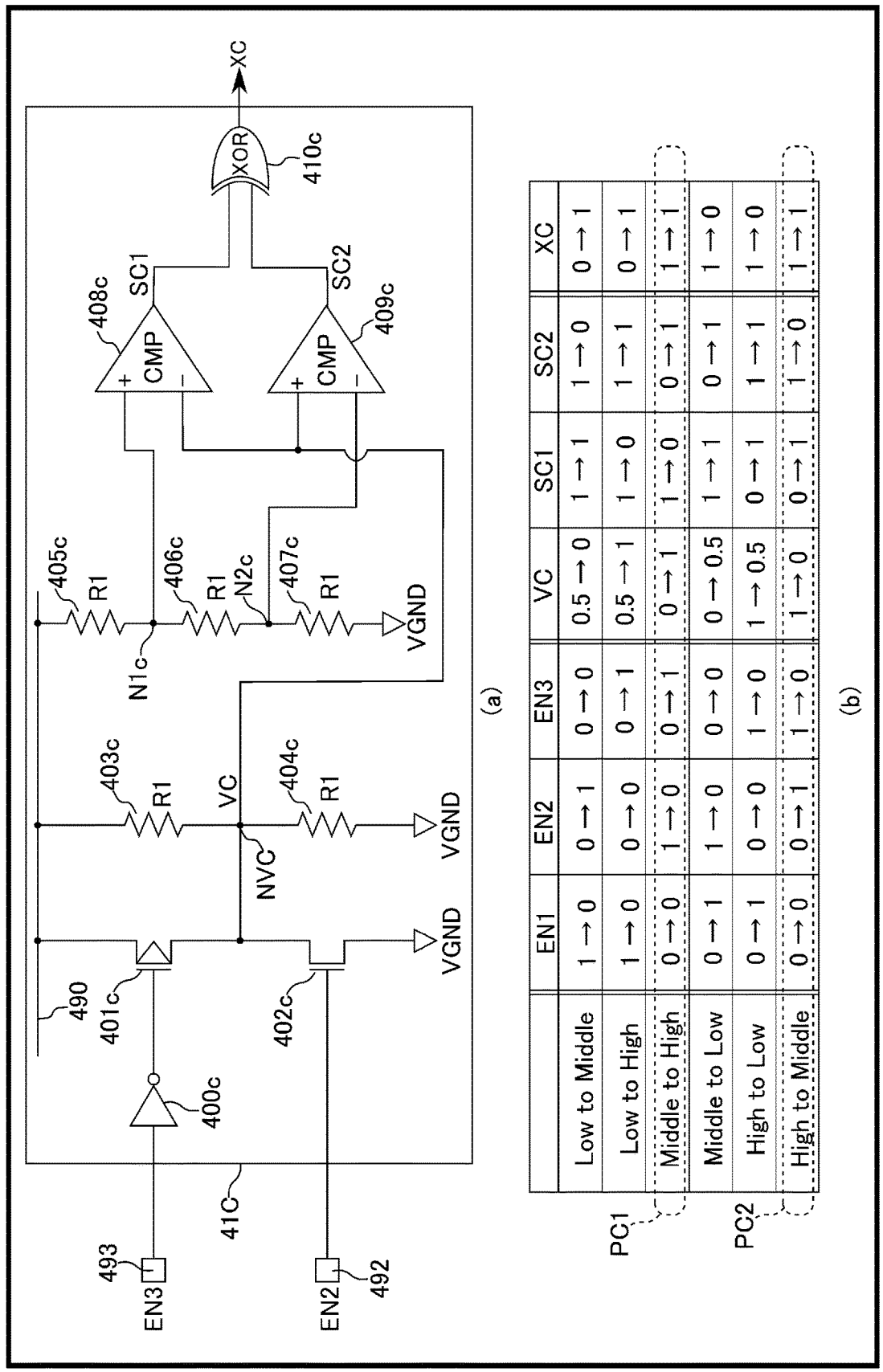
FIG. 9 is a diagram illustrating a configuration example of the input logic circuit of the semiconductor circuit of the embodiment.

FIG. 9 is a schematic view for describing a configuration example and an operation of the circuit block 41C in the determination circuit 40 of FIG. 6.

Part (a) of FIG. 9 is a circuit diagram illustrating an internal configuration of the circuit block 41C in the determination circuit 40.

As illustrated in part (a) of FIG. 9, the circuit block 41C includes an inverter 400c, transistors 401c and 402c, resistors 403c, 404c, 405c, 406c and 407c, operational amplifiers 408c and 409c, and a logic gate (XOR gate) 410c.

In the circuit block 41C, the connection relations between the structural elements 400c, 401c, . . . , 410c are substantially the same as in the circuit block 41A of part (a) of FIG. 7 and the circuit block 41B of part (a) of FIG. 8. However, in the following points, the configuration of the circuit block 41C differs from the configuration of the circuit block 41A, 41B.

The inverter 400c receives the control signal EN3. The inverter 400c outputs an inversion signal of the control signal EN3 to a gate of the P-type transistor 401c.

The N-type transistor 402c receives the control signal EN2 at the gate.

The operational amplifier 408c outputs a signal SC1 to one input terminal of the XOR gate 410c, in accordance with the relationship in magnitude between the voltage of an internal node N2c and a voltage VC of an internal node NVC.

The operational amplifier 409c outputs a signal SC2 to the other input terminal of the XOR gate 410c, in accordance with the relationship in magnitude between the voltage of an internal node N2c and a voltage VC of an internal node NVC.

The XOR gate 410c outputs a signal XC indicating a result of an XOR operation of the signals SC1 and SC2.

The circuit block 41C executes determination relating to the switching between the power supply systems of the middle power supply voltage VIN2 and the high power supply voltage VIN3, among the three power supply voltages VIN1, VIN2 and VIN3.

Part (b) of FIG. 9 is a view for describing an operation of the circuit block 41C of part (a) of FIG. 9.

In a case of switching the power supply voltage between the power supply voltage VIN2 that is the middle voltage and the power supply voltage VIN3 that is the high voltage, the circuit block 41C keeps the signal level of the control signal XC at "1" level in accordance with the detection of the input of the power supply voltage VIN2 and/or the input of the power supply voltage VIN3.

For example, as illustrated in a pattern PC1 of part (b) of FIG. 9, in a case where the power supply voltage is switched from the middle power supply voltage VIN2 to the high power supply voltage VIN3, the signal level of the control signal EN2 changes from "1" level to "0" level, and the signal level of the control signal EN3 changes from "0" level to "1" level, in accordance with the input of the high power supply voltage VIN3. Note that the signal level of the control signal EN1 is kept at "0" level.

In a case where the signal level of the control signal EN2 changed from "1" level to "0" level, the transistor 402c is turned off. In a case where the signal level of the control signal EN3 changed from "0" level to "1" level, the transistor 401c is turned on. As a result, the voltage VC of the internal node NVC changes from "0" level to "1" level. The voltage VC becomes higher than the voltage of the internal node N1c, N2c.

In accordance with the change of the voltage VC of the internal node NVC, the output signal SC1 of the operational amplifier 408c changes from "1" level to "0" level. Along with this, the output signal SC2 of the operational amplifier 409c changes from "0" level to "1" level.

The XOR gate 410c receives the signal SC1 that changes from "1" level to "0" level, and the signal SC2 that changes from "0" level to "1" level.

In a case where the XOR gate 410c receives the signal SC1 of "1" level and the signal SC2 of "0" level, the control signal XC of the XOR gate 410c is at "1" level. In accordance with the transition of the signal SC1, SC2, if the XOR gate 410c receives the signal SC1 of "0" level and the signal SC2 of "1" level, the control signal XC of the XOR gate 410c is at "1" level.

In this manner, at the timing of the switching from the middle power supply voltage VIN2 to the high power supply voltage VIN3, the control signal XC of the circuit block 41C is kept at "1" level.

As illustrated in a pattern PC2 of part (b) of FIG. 9, in a case where the power supply voltage is switched from the high power supply voltage VIN3 to the middle power supply voltage VIN2, the signal level of the control signal EN2 changes from "0" level to "1" level, and the signal level of the control signal EN3 changes from "1" level to "0" level, in accordance with the input of the power supply voltage VIN2.

In a case where the signal level of the control signal EN2 changed from "0" level to "1" level, the transistor 402c is turned on. In a case where the signal level of the control signal EN3 changed from "1" level to "0" level, the transistor 401c is turned off. As a result, the voltage VC of the internal node NVC changes from "1" level to "0" level. The voltage VC becomes lower than the voltage of the internal node N1c, N2c.

In accordance with the change of the voltage VC of the internal node NVC, the output signal SC1 of the operational amplifier 408c changes from "0" level to "1" level. Along with this, the output signal SC2 of the operational amplifier 409c changes from "1" level to "0" level.

The XOR gate 410c receives the signal SC1 that changes from "0" level to "1" level, and the signal SC2 that changes from "1" level to "0" level.

In a case where the XOR gate 410c receives the signal SC1 of "0" level and the signal SC2 of "1" level, the control signal XC of the XOR gate 410c is at "1" level. In accordance with the transition of the signal SC1, SC2, if the XOR gate 410c receives the signal SC1 of "1" level and the signal SC2 of "0" level, the control signal XC of the XOR gate 410c is at "1" level.

In this manner, at the timing of the switching from the power supply voltage VIN3 to the power supply voltage VIN2, the control signal XC of the circuit block 41C is kept at "1" level.

In cases other than the switching of the power supply voltage between the power supply voltage VIN2 and the power supply voltage VIN3, the transition pattern of the control signal XC of the XOR gate 410c becomes a transition pattern from "1" level to "0" level, or a transition pattern from "0" level to "1" level.

In this manner, in a case where the transition occurs in the signal levels of the control signal EN2 and control signal EN3, the circuit block 41C continues the output of the signal XC of "1" level.

Accordingly, the circuit block 41C can specify the switching from the middle power supply voltage VIN2 to high power supply voltage VIN3, or the switching from the high power supply voltage VIN3 to middle power supply voltage VIN2.

The logic circuit 50 receives the signals XA, XB and XC from the circuit blocks 41A, 41B and 41C. The logic circuit 50 executes various calculation processes (for example, a logical operation) for the signal XA, XB, XC. Based on the supplied signal XA, XB, XC, the logic circuit 50 controls the level of the control signal SW1, SW2, SW3, SW4 of the switch 211, 212, 213, 214 of the input voltage detection circuit.

Figure 10:
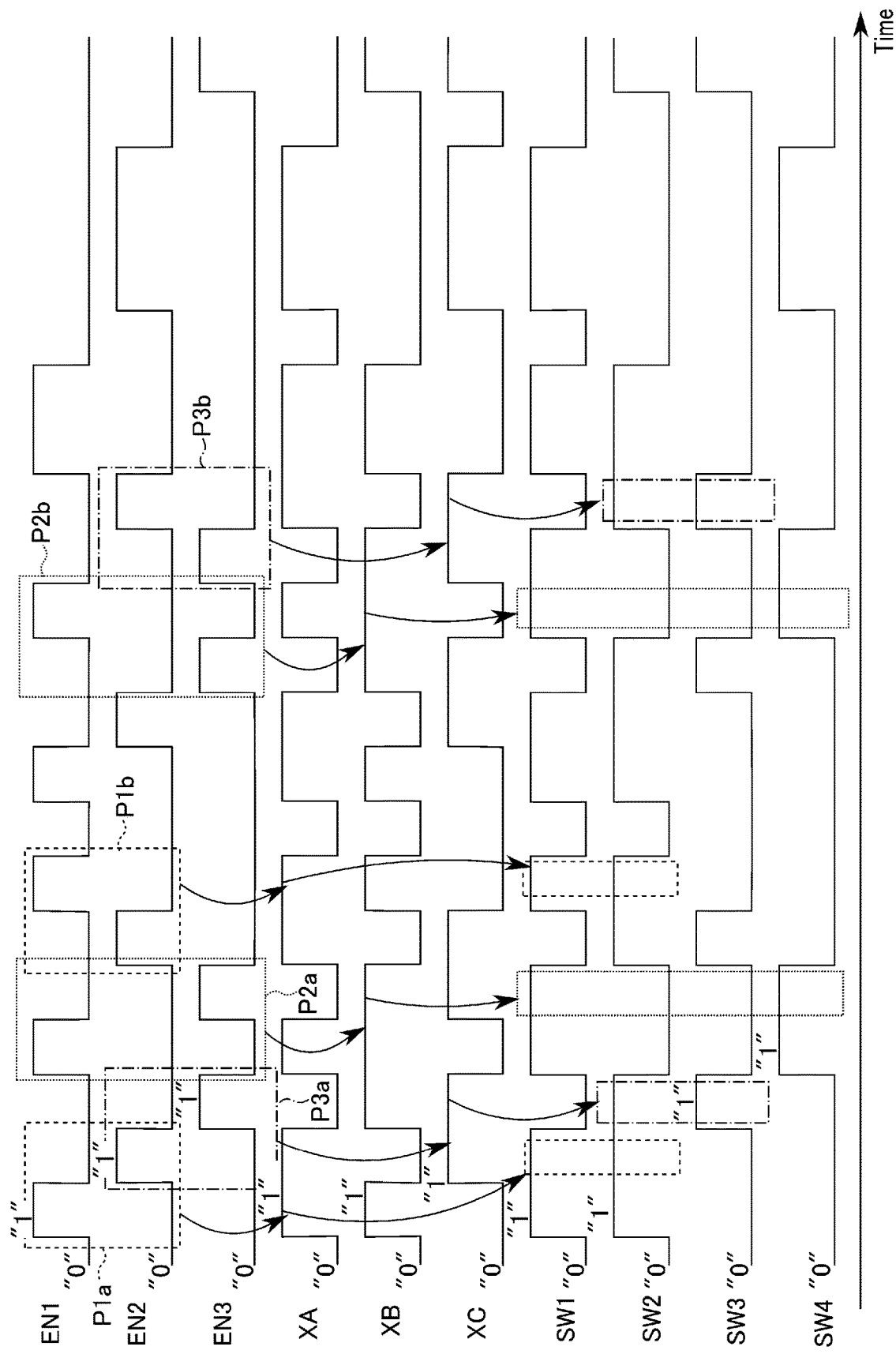
FIG. 10 is a diagram illustrating an operation example of the input logic circuit of the semiconductor circuit of the embodiment.

FIG. 10 is a diagram illustrating a simulation result of transitions of the signals XA, XB and XC and the signals SW1, SW2, SW3 and SW4 in accordance with the control signals EN1, EN2 and EN3 in the power supply switching circuit 10 of the present embodiment.

In FIG. 10, the abscissa axis corresponds to time, and the ordinate axis corresponds to a signal level of each signal.

As illustrated in FIG. 10, in a case (pattern P1a) where the control signal EN1 transitions from "1" level to "0" level and the control signal EN2 transitions from "0" level to "1" level, the signal XA is kept at "1" level over two cycles. In this case, the signal SW1 and signal SW2 are set at "1" level. Thereby, the switch 211 and switch 212 are set in the ON state.

In a case (pattern P1b) where the control signal EN1 transitions from "0" level to "1" level and the control signal EN2 transitions from "1" level to "0" level, the signal XA is kept at "1" level over two cycles. In this case, the signal SW1 and signal SW2 are set at "1" level. Thereby, the switch 211 and switch 212 are set in the ON state.

In a case (pattern P2a) where the control signal EN1 transitions from "1" level to "0" level and the control signal EN3 transitions from "0" level to "1" level, the signal XB is kept at "1" level over two cycles. In this case, the signal SW1 and signal SW4 are set at "1" level. Thereby, the switch 211 and switch 214 are set in the ON state.

In a case (pattern P2b) where the control signal EN1 transitions from "0" level to "1" level and the control signal EN3 transitions from "1" level to "0" level, the signal XB is kept at "1" level over two cycles. In this case, the signal SW1 and signal SW4 are set at "1" level. Thereby, the switch 211 and switch 214 are set in the ON state.

In a case (pattern P3a) where the control signal EN2 transitions from "1" level to "0" level and the control signal EN3 transitions from "0" level to "1" level, the signal XC is kept at "1" level over two cycles. In this case, the signal SW2 and signal SW3 are set at "1" level. Thereby, the switch 212 and switch 213 are set in the ON state.

In a case (pattern P3b) where the control signal EN2 transitions from "0" level to "1" level and the control signal EN3 transitions from "1" level to "0" level, the signal XC is kept at "1" level over two cycles. In this case, the signal SW2 and signal SW3 are set at "1" level. Thereby, the switch 212 and switch 213 are set in the ON state.

In this manner, by the input logic circuit 120 including the determination circuit 40 and logic circuit 50, the ON and OFF of the switches 211, 212, 213 and 214 in the input voltage detection circuit 110 are controlled in accordance with the transitions of the signal levels of the control signals EN1, EN2 and EN3.

Thereby, the input voltage detection circuit 110 can detect the input power supply voltages VIN1, VIN2 and VIN3.

(a-3) Gate Driver Control Circuit

Figure 11:
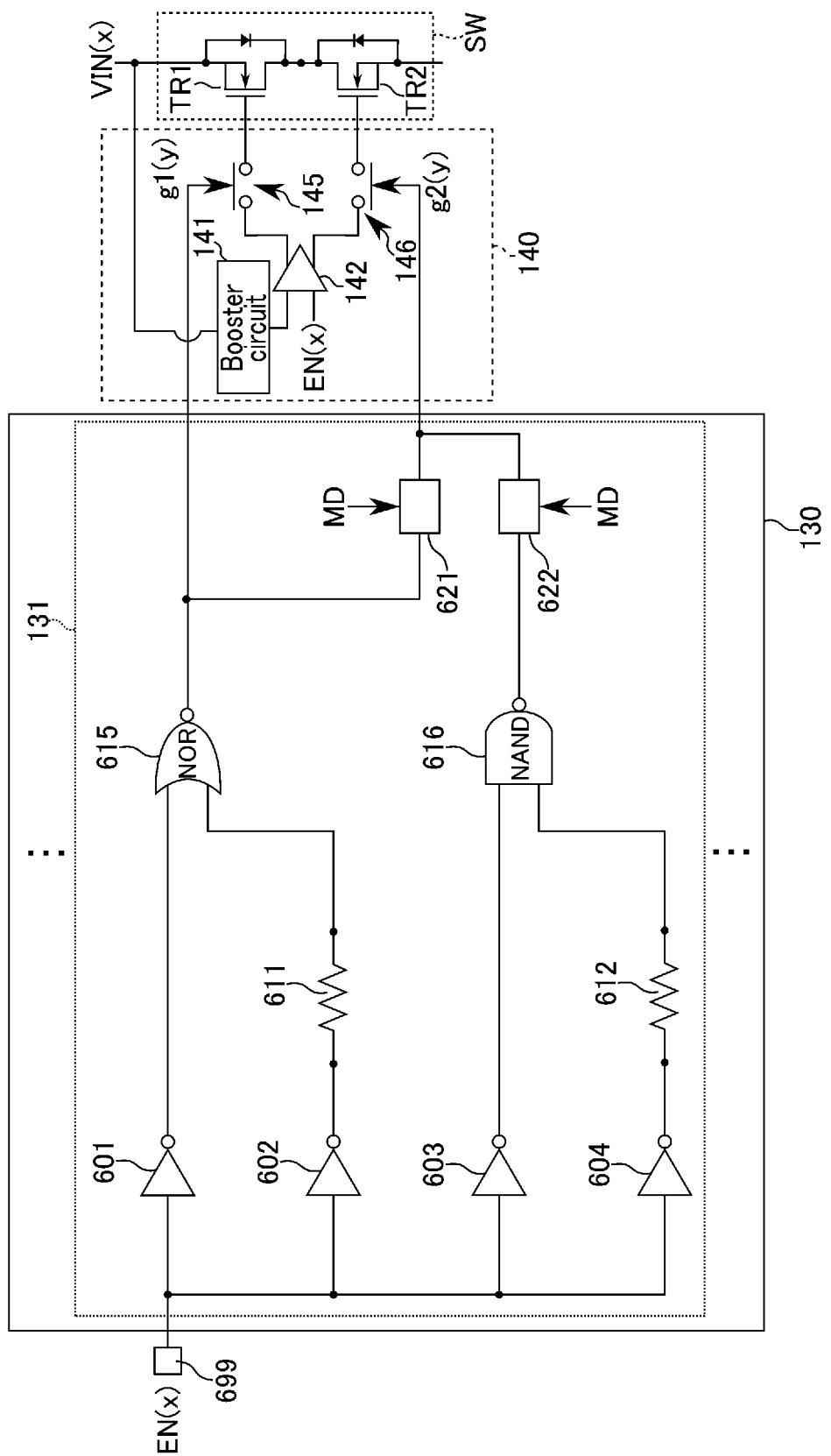
FIG. 11 is a diagram illustrating a configuration example of a gate driver control circuit of the semiconductor circuit of the embodiment.
Figure 12:
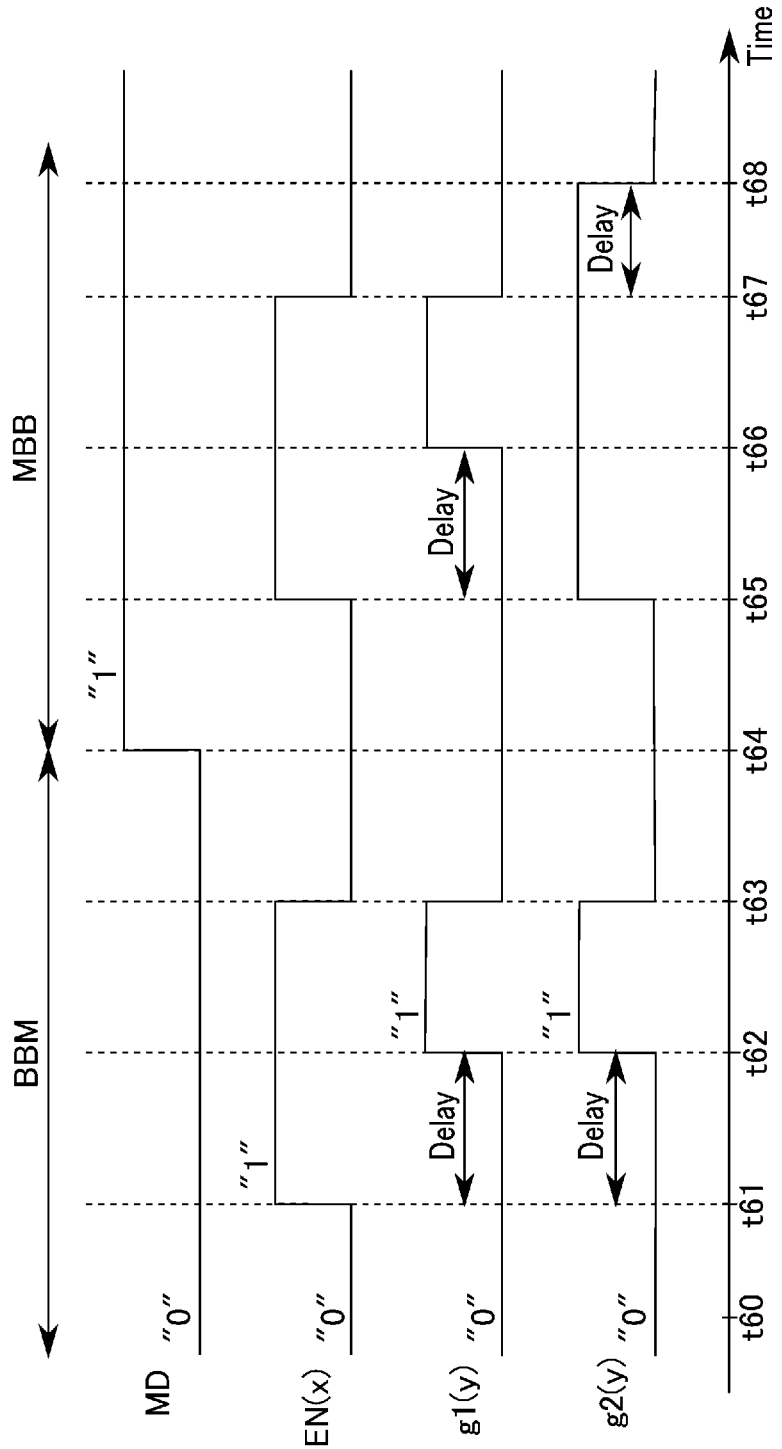
FIG. 12 is a diagram illustrating an operation example of the gate driver control circuit of the semiconductor circuit of the embodiment.

Referring to FIG. 11 and FIG. 12, a description is given of an internal configuration of the gate driver control circuit 130 in the power supply switching circuit 10 of the present embodiment.

The gate driver control circuit 130 controls the operation of the driver circuit 140. As described above, the driver circuit 140 includes the gate drivers 142 (142*a*, 142*b*, 142*c*) in such a manner as to correspond to the power supply switches SW (SWA, SWB, SWC).

The gate driver control circuit 130 includes a circuit block (hereinafter referred to as "control block") 131 for controlling each gate driver 142. For example, the number of control blocks 131 is equal to the number of gate drivers 142 and the number of power supply switches SW.

FIG. 11 is a circuit diagram illustrating an internal configuration of the gate driver control circuit 130 in the power supply switching circuit 10 of the present embodiment.

As illustrated in FIG. 11, the gate driver control circuit 130 includes a plurality of control blocks 131. Each of the control blocks 131 is connected to the corresponding gate driver 142 (driver circuit 140). Each control block 131 corresponds to one gate driver 142. The control block 131 includes inverters 601, 602, 603 and 604, resistors 611 and 612, a NOR gate 615, a NAND gate 616, and switches 621 and 622.

In the gate driver control circuit 130, the control block 131 receives the control signal EN(x). The control signal EN(x) is supplied to a terminal 699. In accordance with the control signal EN(x), the control block 131 outputs gate signals g1(y) and g2(y) to the corresponding switches 145 and 146 of the corresponding gate driver 142. Here, "x" can take one value among "1", "2" and "3" in accordance with the corresponding gate driver 142. Symbol "y" can take one value among "a", "b" and "c" in accordance with the corresponding power supply switch SWA, SWB, SWC.

An input terminal of the inverter 601 is connected to the terminal 699. An output terminal of the inverter 601 is connected to one input terminal of the NOR gate 615. The inverter 601 outputs an inversion signal of the control signal EN(x).

An input terminal of the inverter 602 is connected to the terminal 699. An output terminal of the inverter 602 is connected to the other input terminal of the NOR gate 615 via the resistor 611. The inverter 602 outputs an inversion signal of the control signal EN(x).

An input terminal of the inverter 603 is connected to the terminal 699. An output terminal of the inverter 603 is connected to one input terminal of the NAND gate 616. The inverter 603 outputs an inversion signal of the control signal EN(x).

An input terminal of the inverter 604 is connected to the terminal 699. An output terminal of the inverter 604 is connected to the other input terminal of the NAND gate 616 via the resistor 612. The inverter 604 outputs an inversion signal of the control signal EN(x).

One end of the resistor 611 is connected to the output terminal of the inverter 602. The other end of the resistor 611 is connected to the other input terminal of the NOR gate 615. One end of the resistor 612 is connected to the output terminal of the inverter 604. The other end of the resistor 612 is connected to the other input terminal of the NAND gate 616.

The NOR gate 615 receives the inversion signal of the control signal EN(x) from the inverter 601 by the one input terminal. The NOR gate 615 receives the inversion signal of the control signal EN(x) from the inverter 602 and resistor 611 by the other input terminal. The other input terminal of the NOR gate 615 is supplied with the inversion signal of the control signal EN(x) that is delayed. The NOR gate 615 executes a negative logical sum operation (NOR operation) between the two supplied signals. The NOR gate 615 outputs, as a gate signal g1(y), a signal indicating a result of the NOR operation. The signal, which is output from the NOR gate 615, is output as a gate signal g2(y) via the switch 621.

The NAND gate 616 receives the inversion signal of the control signal EN(x) from the inverter 603 by the one input terminal. The NAND gate 616 receives the inversion signal of the control signal EN(x) from the inverter 604 and resistor 612 by the other input terminal. The other input terminal of the NAND gate 616 is supplied with the inversion signal of the control signal EN(x) that is delayed. The NAND gate 616 executes a negative logical product operation (NAND operation) between the two supplied signals. The NAND gate 616 outputs, as a gate signal g2(y), a signal indicating a result of the NAND operation via the switch 622.

The switch 621 is provided between an output terminal of the NOR gate 615 and a control terminal of the switch 146. The switch 622 is provided between an output terminal of the NAND gate 616 and the control terminal of the switch 146. The switch 621 and switch 622 receive a mode signal MD. In accordance with the signal level of the mode signal MD, one of the switch 621 and switch 622 is turned on.

For example, the gate signals g1(y) and g2(y) are supplied to the switches 145 and 146, respectively. The switches 145 and 146 are turned on or off in accordance with the gate signals g1(y) and g2(y).

Based on the control signal EN(x) and gate signals g1(y) and g2(y), the gate driver 142 supplies driving voltages to the gates of the transistors TR1 and TR2 in the power supply switch SW via the switches 145 and 146. For example, the gate driver 142, which receives the control signal EN(x) of "1" level, outputs driving voltages (gate voltages) that set the transistors TR1 and TR2 of the power supply switch SW in the ON state.

One end of the switch 145 is connected to an output terminal of the gate driver 142. The other end of the switch 145 is connected to the gate of the transistor TR1. A control terminal of the switch 145 receives the gate signal g1(y). Based on the gate signal g1(y), the switch 145 controls an electrical connection between the gate drier 142 and the transistor TR1. In a case where the switch 145 is in the ON state, the driving voltage from the gate driver 142 is supplied to the gate of the transistor TR1. In a case where the switch 145 is in the OFF state, the driving voltage from the gate driver 142 is not supplied to the gate of the transistor TR1.

One end of the switch 146 is connected to an output terminal of the gate driver 142. The other end of the switch 146 is connected to the gate of the transistor TR2. A control terminal of the switch 146 receives the gate signal g2(y). Based on the gate signal g2(y), the switch 146 controls an electrical connection between the gate drier 142 and the transistor TR2. In a case where the switch 146 is in the ON state, the driving voltage from the gate driver 142 is supplied to the gate of the transistor TR2. In a case where the switch 146 is in the OFF state, the driving voltage from the gate driver 142 is not supplied to the gate of the transistor TR2.

Based on the gate signals g1(y) and g2(y) from the control block 131 of the gate driver control circuit 130, the conduction state between the gate driver 142 and the power supply switch SW is controlled. As a result, the operation state of the power supply switch SW can be controlled.

Note that the control block 131 and the gate driver 142 may be configured such that the gate driver 142 supplies the gate signals g1(y) and g2(y) to the transistors TR1 and TR2, based on the control of the control block 131.

FIG. 12 is a timing chart illustrating an operation example of the gate driver control circuit 130 in the power supply switching circuit 10 of the present embodiment.

As illustrated in FIG. 12, in a period from time instant t60 to time instant t64, the mode signal MD is set at, for example, "0 (L)" level. The mode signal MD of "0" level indicates that the operation mode to be executed is the BBM mode. Note that the mode signal MD may be a signal that is supplied from the input voltage detection circuit 110, or may be a signal (external mode signal MDx) that is supplied from the outside of the power supply switching circuit 10.

At time instant t61, the signal level of the control signal EN(x) changes from "0" level to "1" level. The signal of "1" level is supplied to each of the inverters 601, 602, 603 and 604. Each of the inverters 601, 602, 603 and 604 outputs a signal of "0" level.

The NOR gate 615 receives the signal from the inverter 601 by the one input terminal. The NOR gate 615 receives the signal from the inverter 602 via the resistor 611 by the other input terminal. The output signal of the inverter 602 is delayed by the resistor 611 and supplied to the NOR gate 615. Therefore, at a beginning of a period during which the NOR gate 615 receives the signal of "0" level from the inverter 601, the NOR gate 615 receives the signal of "1" level from the inverter 602. As a result, the signal level of the output signal of the NOR gate 615 transitions from "0" level to "1" level after the passage of a delay time corresponding to the resistance value of the resistor 611, compared to the timing of the transition from "0" level to "1" level in the control signal EN(x).

The NAND gate 616 receives the signal from the inverter 603 by the one input terminal. The NAND gate 616 receives the signal from the inverter 604 via the resistor 612 by the other input terminal. The output signal of the inverter 604 is delayed by the resistor 612 and supplied to the NAND gate 616. Therefore, at a beginning of a period during which the NAND gate 616 receives the signal of "0" level from the inverter 603, the NAND gate 616 receives the signal of "1" level from the inverter 604. As a result, the signal level of the output signal of the NAND gate 616 transitions from "0" level to "1" level after the passage of a delay time corresponding to the resistance value of the resistor 612, compared to the timing of the transition from "0" level to "1" level in the control signal EN(x).

At time instant t62, the output signal of the NOR gate 615 is output as the gate signal g1(y). Therefore, the gate signal g1(y) of "1" level is supplied to the gate of one transistor TR1 of the common-drain MOSFET. The transistor TR1 is turned on in accordance with the delay of the gate signal g1(y).

In the period in which the mode signal MD is at "0" level, the switch 621 is turned on and the switch 622 is turned off. By the switch 622 in the OFF state, the output signal of the NAND gate 616 is shut off. Therefore, the output signal of the NOR gate 615 is output as the gate signal g2(y) via the switch 621 in the ON state. As a result, at time instant t62, the gate signal g2(y) of "1" level is supplied to the gate of the other transistor TR2 of the common-drain MOSFET. The transistor TR2 is turned on in accordance with the delay of the gate signal g2(y).

In this manner, in the case where the mode signal MD is at "0" level, the phase of the gate signal g2(y) is the same as the phase of the gate signal g1(y). Accordingly, both of the transistors TR1 and TR2 are turned on at substantially the same time.

In a period from time instant t62 to time instant t63, the power supply switch SW constituted by the common-drain MOSFET is turned on. The power supply voltage VIN(x) is transferred from the input terminal to output terminal of the power supply switching circuit 10 via the power supply switch SW in the ON state.

At time instant t63, the signal level of the control signal EN(x) transitions from "1" level to "0" level. The inverters 601, 602, 603 and 604 receive the signal of "0" level. The inverters 601, 602, 603 and 604 output signals of "1" level. By the signal of "1" level from the inverter 601, the output signal of the NOR gate 615 changes from "1" level to "0" level at time instant t63. Thereby, the signal levels of the gate signals g1(y) and g2(y) change from "1" level to "0" level.

By the gate signals g1(y) and g2(y) of "0" level, the switches 145 and 146 are turned off. By the switches 145 and 146 in the OFF state, the supply of the driving voltage from the gate driver 142 to the power supply switch SW is stopped. The power supply switch SW terminates the transfer of the power supply voltage VIN(x).

In this manner, the operation of the power supply switch SW, which is constituted by the common-drain MOSFET, is controlled such that the power supply switching circuit 10 operates by the BBM mode.

Note that the NOR gate 615 receives the signal of "1" level from the inverter 602, after the passage of a certain delay time from the reception of the signal of "1" level from the inverter 601. In a case where the NOR gate 615 receives the signal of "1" level from the inverter 601 and the signal of "1" level from the inverter 602, the output signal of the NOR gate 615 is at "0" level.

At time instant t64, the signal level of the mode signal MD changes from "0" level to "1" level. The mode signal MD of "1" level indicates that the operation mode to be executed is the MBB mode.

At time instant t65, the signal level of the control signal EN(x) changes from "0" level to "1" level. The inverters 601, 602, 603 and 604 receive the control signal En (x) of "1" level. The inverters 601, 602, 603 and 604 output signals of "0" level. As described above, the output signal of the inverter 602 is supplied to the NOR gate 615, with the delay from the output signal of the inverter 601. Therefore, the signal level of the gate signal g1(y) changes from "0" level to "1" level at time instant t66 that is later than the timing (time instant t65) of the transition from "0" level to "1" level of the control signal EN(x).

Here, by the mode signal MD of "1" level, the switch 621 is turned off and the switch 622 is turned on. In this case, the output signal of the NAND gate 616 is selected as the gate signal g2(y). At a beginning of a period during which the NAND gate 616 receives the signal of "0" level from the inverter 603, the NAND gate 616 receives the signal of "1" level from the inverter 604, which is delayed by the resistor 612. Therefore, at time instant t65, without the influence of the delay of the signal, the signal of "1" level from the NAND gate 616 is output as the gate signal g2(y) via the switch 622 in the ON state. The NAND gate 616 outputs the signal of "1" level, even after the signal level of the signal received from the inverter 604 changes from "0" level to "1" level.

As a result, in a period from time instant t65 to time instant t67, the signal level of the gate signal g2(y) is "1" level. The signal level of the gate signal g2(y) is "1" level before the signal level of the gate signal g1(y) changes to "1" level.

In this manner, in the period from time instant t65 to time instant t66, the transistor TR1 of the common drain MOSFET is turned off in accordance with the delay of the gate signal g1(y). On the other hand, in the period from time instant t65 to time instant t66, the transistor TR2 of the common drain MOSFET is turned on. As a result, the power supply voltage is transferred by the transistor TR2 on the load side of the common-drain MOSFET. In a period from time instant t66 to time instant t67, the transistor TR1 is turned on. Thereby, the power supply voltage VIN is transferred from the input terminal to output terminal of the power supply switching circuit 10 via the power supply switch SW that is constituted by the common-drain MOSFET in the ON state.

At time instant t67, the signal level of the control signal EN(x) changes from "1" level to "0" level. Thereby, the signal level of the gate signal g1(y) corresponding to the output signal from the NOR gate 615 changes from "1" level to "0" level.

As described above, the NAND gate 616 receives the delayed signal from the inverter 604. Thus, even if the NAND gate 616 receives the signal of "1" level from the inverter 603, in the period in which the delayed signal of "0" level is supplied from the inverter 604, the NAND gate 616 outputs the signal of "1" level as the gate signal g2(y). Therefore, in a period from time instant t67 to time instant t68, the signal level of the gate signal g2(y) is kept at "1" level by the delay.

As a result, even after the transistor TR1 of the common-drain MOSFET is turned off, the transistor TR2 of the common-drain MOSFET is kept in the ON state in a certain period corresponding to the delay of the gate signal g2(y). In this manner, by the control of the gate driver control circuit 130, the transistor TR2 on the load side of the common-drain MOSFET is turned off with a delay from the OFF of the transistor TR1. As a result, in the MBB mode, a reverse flow of current in the common-drain MOSFET, which transitions from the ON state to OFF state, can be prevented.

At time instant t68, by the supply of the signal of "1" level from the inverter 604 to the NAND gate 616, the signal level of the gate signal g2(y) changes from "1" level to "0" level. Thereby, the power supply switch SW, which is constituted by the common-drain MOSFET, is turned off. The transfer of the power supply voltage VIN(x) via the power supply switch SW is terminated.

In this manner, the operation of the power supply switch SW, which is constituted by the common-drain MOSFET, is controlled such that the power supply switching circuit 10 operates by the MBB mode.

By the control by the gate driver control circuit 130, which is illustrated in FIG. 12, the power supply voltage VIN(x) is transferred from the power supply switching circuit 10 to a rear-stage circuit via the power supply switch SW that is constituted by the common-drain MOSFET.

As described above, the gate driver control circuit 130 can control the operation of the power supply switch SW by the gate driver 142.

(2) Operation Example

Figure 13:
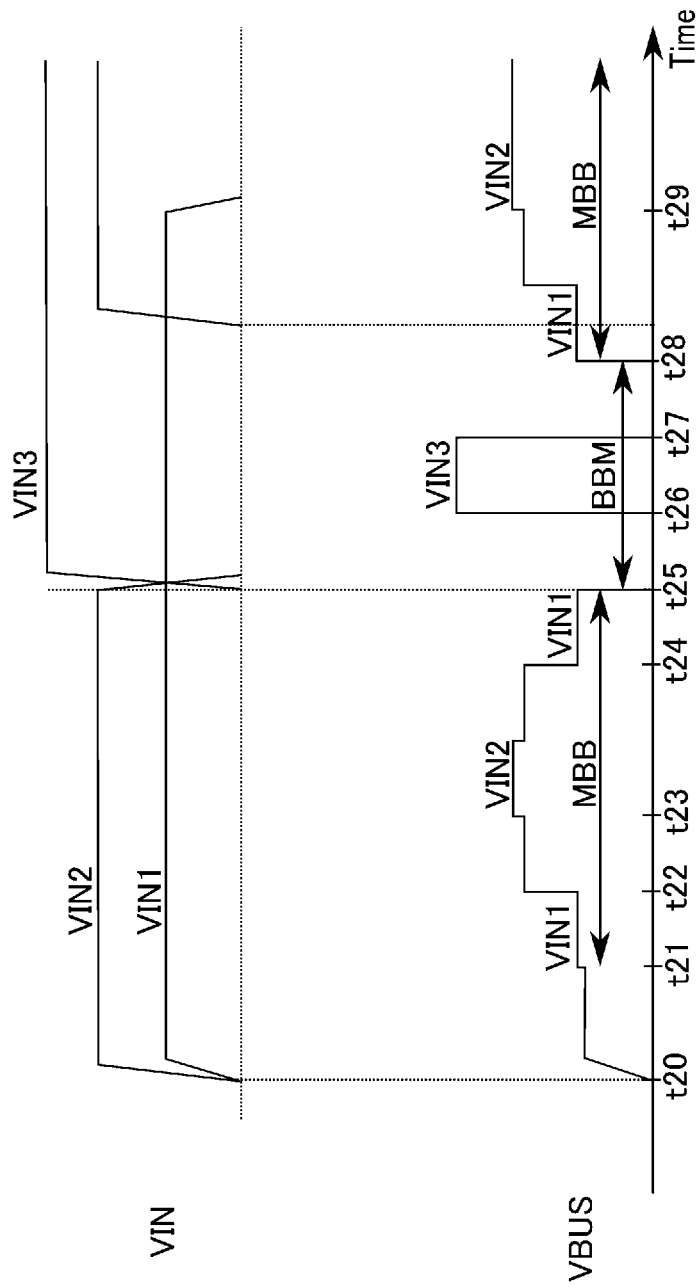
FIG. 13 is a diagram illustrating an operation example of the semiconductor circuit of the embodiment.

Referring to FIG. 13, an operation example of the power supply switching circuit 10 of the present embodiment is described.

FIG. 13 is a diagram illustrating a simulation result of the operation of the power supply switching circuit 10 of the present embodiment. In FIG. 13, the abscissa axis of a graph corresponds to time, and the ordinate axis of the graph corresponds to voltage.

As illustrated in FIG. 13, at time instant t20, the operation of the power supply switching circuit of FIG. 3 starts.

At time instant t20, the power supply voltage VIN1 is supplied to the power supply line 190A, and the power supply voltage VIN2 is supplied to the power supply line 190B.

In a period from time instant t20 to time instant t21, by the detection of the input of the power supply voltage VIN, an output voltage VBUS of a certain magnitude is output via the power supply switch SWA (or power supply switch SWB).

At time instant t21, the switching of the power supply system by the MBB mode starts. The power supply switch SWA is set in the ON state. Thereby, the output voltage VBUS corresponding to the power supply voltage VIN1 is output.

At time instant t22, the power supply switch SWB is set in the ON state. Thereby, the power supply system used for the supply of the power supply voltage changes from the power supply system of the power supply voltage VIN1 to the power supply system of the power supply voltage VIN2. At time instant t22, for example, the power supply switch SWA may be kept in the ON state.

At time instant t23, the output voltage VBUS of the power supply voltage VIN2 is output. In this manner, by the MBB mode, the switching from the power supply voltage VIN1 to the power supply voltage VIN2 is executed.

Thereafter, the switching of the power supply system from the power supply voltage VIN2 to the power supply voltage VIN1 is executed.

After the output voltage of the power supply voltage VIN2 is output, the power supply switch SWB is set in the OFF state at time instant t24. The magnitude of the output voltage VBUS changes from the power supply voltage VIN2 to the power supply voltage VIN1. Thereby, the output voltage VBUS of the power supply voltage VIN1 is output.

At time instant t25, the power supply voltage VIN3 is supplied. Along with this, the supply of the power supply voltage VIN2 is stopped.

In accordance with the detection of the power supply voltage VIN3 (and power supply voltage VIN1), the switching of the power supply voltage by the BBM mode is executed subsequently to the switching of the power supply voltage by the MBB mode.

At time instant t25, the power supply switches SWA, SWB and SWC are set in the OFF state. Thereby, the output voltage VBUS becomes a ground voltage (0 V).

At time instant t26, the power supply switch SWC is set in the ON state. The output voltage VBUS of the power supply voltage VIN3 is output. In this manner, by the BBM mode, the switching from the power supply voltage VIN1 to the power supply voltage VIN3 is executed.

At time instant t27, the power supply switch SWC is set in the OFF state. Thereby, the output voltage VBUS becomes the ground voltage. Thus, the switching of the power supply voltage by the BBM mode is completed.

The switching of the power supply voltage by the MBB mode is executed subsequently to the switching of the power supply voltage by the BBM mode.

At time instant t28, the power supply switch SWA is set in the ON state. Thereby, the output voltage VBUS of the power supply voltage VIN1 is output. Thereafter, the power supply voltage VIN2 is supplied.

By the detection of the supply of the power supply voltage VIN2, the power supply switch SWB is set in the ON state. Thereby, at time instant t29, the magnitude of the output voltage VBUS changes continuously from the power supply voltage VIN1 to the power supply voltage VIN2.

As described above, the power supply switching circuit 10 of the present embodiment can achieve the switching of the power supply system by a plurality of operation modes as illustrated in FIG. 2. In the power supply switching circuit 10 of the present embodiment, the switching of the power supply system by the multiple operation modes is automatically executed based on the detection result of the power supply voltage by the input voltage detection circuit 110.

(3) Modification

Figure 14:
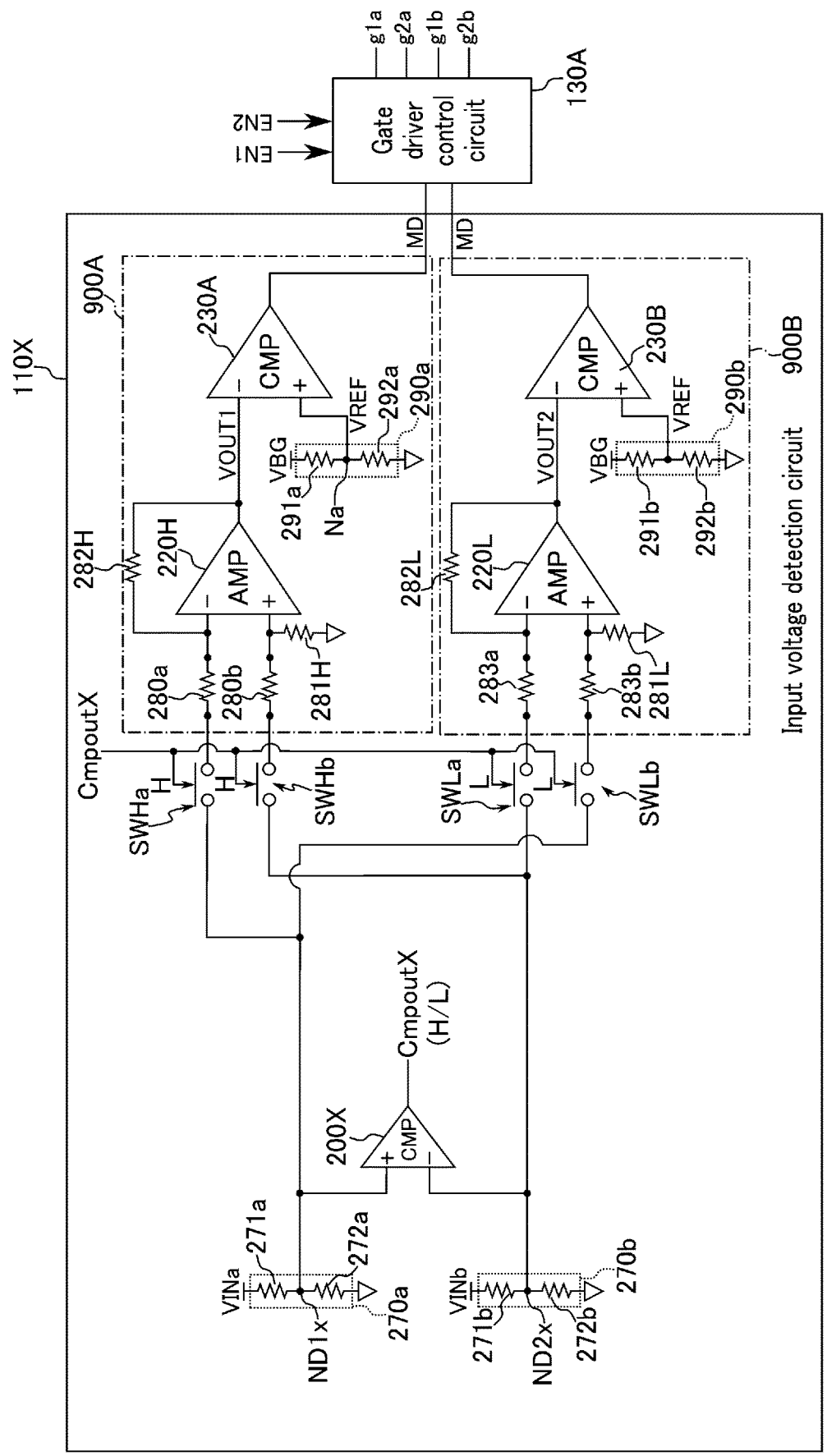
FIG. 14 is a diagram illustrating a modification of the semiconductor circuit of the embodiment.

Referring to FIG. 14, a modification of the power supply switching circuit 10 of the present embodiment is described.

FIG. 14 is a circuit diagram illustrating a modification of the power supply switching circuit 10 of the present embodiment.

There is a case where the number of power supply voltages supplied to the power supply switching circuit 10 is two. In addition, there is a case where the relationship in magnitude between the two power supply voltages is unfixed.

In such cases, the power supply voltage can be switched by an appropriate mode by an input voltage detection circuit 110X illustrated in FIG. 14.

As illustrated in FIG. 14, a power supply voltage VINa and a power supply voltage VINb are supplied to the input voltage detection circuit 110X of the modification.

The power supply voltage VINa is applied to a resistor circuit 270a including resistors 271a and 272a. The power supply voltage VINa is applied to one end of the resistor 271a. The other end of the resistor 271a is connected to one end of the resistor 272a via a connection node ND1x. The other end of the resistor 272a is grounded. The power supply voltage VINa is divided by the resistor circuit 270a.

The power supply voltage VINb is applied to a resistor circuit 270b including resistors 271b and 272b. The power supply voltage VINb is applied to one end of the resistor 271b. The other end of the resistor 271b is connected to one end of the resistor 272b via a connection node ND2x. The other end of the resistor 272b is grounded. The power supply voltage VINb is divided by the resistor circuit 270b.

The relationship in magnitude between the power supply voltage VINa and the power supply voltage VINb is unfixed.

The input voltage detection circuit 110X includes a plurality of operational amplifiers 200X, 220H, 220L, 230A and 230B.

One input terminal (for example, a noninversion input terminal) of the operational amplifier 200X is connected to the connection node ND1x of the resistor circuit 270a. The other input terminal (for example, an inversion input terminal) of the operational amplifier 200X is connected to the connection node ND2x of the resistor circuit 270b.

The operational amplifier 200X functions as a comparator. The operational amplifier 200X executes a comparison in regard to the relationship in magnitude between the divided power supply voltage VINa and the divided power supply voltage VINb. In a case where the power supply voltage VINa is higher than the power supply voltage VINb, the operational amplifier 200X outputs a signal CmpoutX of "1" level. In a case where the power supply voltage VINa is lower than the power supply voltage VINb, the operational amplifier 200X outputs a signal CmpoutX of "0" level.

One input terminal (for example, a noninversion input terminal) of the operational amplifier 220H is connected to the connection node ND2x of the resistor circuit 270b via a resistor 280b and a switch SWHb. Thereby, the one input terminal of the operational amplifier 220H receives the divided power supply voltage VINb. The other input terminal (for example, an inversion input terminal) of the operational amplifier 220H is connected to the connection node ND1x of the resistor circuit 270a via a resistor 280a and a switch SWHa. Thereby, the other input terminal of the operational amplifier 220H receives the divided power supply voltage VINa.

The operational amplifier 220H functions as a subtraction circuit. The operational amplifier 220H amplifies a potential difference between the two supplied voltages VINa and VINb. The operational amplifier 220H outputs an amplified voltage VOUT1 to the rear-stage operational amplifier 230A.

One input terminal (for example, a noninversion input terminal) of the operational amplifier 220L is connected to the connection node ND1x of the resistor circuit 270a via a resistor 283b and a switch SWLb. Thereby, the one input terminal of the operational amplifier 220L receives the divided power supply voltage VINa. The other input terminal (for example, an inversion input terminal) of the operational amplifier 220L is connected to the connection node ND2x of the resistor circuit 270b via a resistor 283a and a switch SWLa. Thereby, the other input terminal of the operational amplifier 220L receives the divided power supply voltage VINb.

The operational amplifier 220L functions as a subtraction circuit. The operational amplifier 220L amplifies a potential difference between the two supplied voltages VINa and VINb. The operational amplifier 220L outputs an amplified voltage VOUT2 to the rear-stage operational amplifier 230B.

The switch SWH is turned on or off in accordance with the signal level of the output signal CmpoutX of the operational amplifier 200X. For example, in a case where the signal level of the output signal CmpoutX is at "1 (H)" level, the switch SWH is turned on.

The switch SWL is turned on or off in accordance with the signal level of the output signal CmpoutX of the operational amplifier 200X. For example, in a case where the signal level of the output signal CmpoutX is at "0 (L)" level, the switch SWL is turned on.

In this manner, by the ON and OFF of the switches SWH and SWL, one of the two operational amplifiers 220H and 220L receives the power supply voltage VINa, VINb.

One input terminal (for example, a noninversion input terminal) of the operational amplifier 230A receives a reference voltage VREF from a resistor circuit 290a. The other input terminal (for example, an inversion input terminal) of the operational amplifier 230A receives the output signal VOUT1 from the operational amplifier 220H. An output terminal of the operational amplifier 230A is connected to a gate driver control circuit 130A.

The operational amplifier 230A functions as a comparator. The operational amplifier 230A outputs to the gate driver control circuit 130A a signal MD indicating a comparison result between the reference voltage VREF and the voltage VOUT1.

One input terminal (for example, a noninversion input terminal) of the operational amplifier 230B receives a reference voltage VREF from a resistor circuit 290b. The other input terminal (for example, an inversion input terminal) of the operational amplifier 230B receives the output signal VOUT2 from the operational amplifier 220L. An output terminal of the operational amplifier 230B is connected to the gate driver control circuit 130A.

The operational amplifier 230B functions as a comparator. The operational amplifier 230B outputs to the gate driver control circuit 130A a signal MD indicating a comparison result between the reference voltage VREF and the voltage VOUT2.

The signal MD that is output from the operational amplifier 230A, 230B is a mode signal.

The gate driver control circuit 130A receives the mode signal MD from one of the two operational amplifiers 230A and 230B. The gate driver control circuit 130A controls the signal levels of gate signals g1a, g2a, g1b and g2b in accordance with the supplied mode signal MD and control signals EN1 and EN2.

In accordance with the relationship in magnitude between the power supply voltages VINa and VINb, the mode signal MD corresponding to the power supply voltages VINa and VINb is output, responding to the output signal VOUT of one of the operational amplifiers 220H and 220L functioning as subtraction circuits.

In a case where the power supply voltage VINa is higher than the power supply voltage VINb, the operational amplifiers 220H and 230A output the mode signal MD corresponding to the power supply voltage VINa, VINb, in accordance with the signal CmpoutX of "H" level.

In a case where the power supply voltage VINa is lower than the power supply voltage VINb, the operational amplifiers 220L and 230B output the mode signal MD corresponding to the power supply voltage VINa, VINb, in accordance with the signal CmpoutX of "L" level.

In this manner, the input voltage detection circuit 110X of the modification can set the mode signal MD for switching the power supply system by an appropriate operation mode, in regard to the two power supply voltages VINa and VINb having an indefinite relationship in magnitude.

(4) CONCLUSION

The power supply switching circuit 10 of the present embodiment includes the input voltage detection circuit using the subtraction circuit.

In the present embodiment, the input voltage detection circuit 110 detects the power supply voltages VIN that are supplied to the power supply switching circuit 10. Based on the detection result of the power supply voltage VIN, the input voltage detection circuit 110 controls the operation of the power supply switch (for example, common-drain MOSFET) SWA, SWB, SWC for switching the power supply system Apw, Bpw, Cpw.

Thereby, the power supply switching circuit 10 of the present embodiment can execute the switching of the power supply voltage by a more appropriate operation mode, in accordance with the magnitude of the input power supply voltage VIN.

In addition, the power supply switching circuit 10 of the present embodiment can integrate circuitry. Therefore, the power supply switching circuit 10 of the present embodiment can reduce the number of parts in the circuitry. As a result, the power supply switching circuit 10 of the present embodiment can contribute to the reduction in device manufacturing cost and the reduction in device size.

As described above, the semiconductor circuit of the present embodiment can improve the characteristics of the semiconductor circuit.

(5) Others

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor circuit comprising:
    a switch circuit including a first switch configured to control an output of a first power supply voltage, and a second switch configured to control an output of a second power supply voltage, the switch circuit being configured to switch the first power supply voltage and the second power supply voltage; and
    a control circuit configured to receive a first control signal related to an input of the first power supply voltage, and a second control signal related to an input of the second power supply voltage, configured to detect the inputs of the first and second power supply voltages, and configured to control an operation mode of the switch circuit, based on the first and second control signals and a detection result of the first and second power supply voltages.

2. The semiconductor circuit according to claim 1, further comprising:
    a detection circuit configured to detect the inputs of the first and second power supply voltages,
    wherein the detection circuit includes a subtraction circuit configured to execute a subtraction process for the first and second power supply voltages.

3. The semiconductor circuit according to claim 2, wherein the detection circuit outputs a mode signal indicating the operation mode to the control circuit, based on a result of the subtraction process.

4. The semiconductor circuit according to claim 3, wherein the control circuit includes:
    a driver circuit configured to control operations of the first and second switches; and
    a gate driver control circuit configured to control the driver circuit by using the mode signal and the first and second control signals.

5. The semiconductor circuit according to claim 1, wherein
    each of the first and second switches includes:
    a first transistor including a first source connected to a power supply system, and a first drain; and
    a second transistor including a second source connected to an output terminal, and a second drain connected to the first drain,
    an operation of the first transistor is controlled based on a first gate signal from the control circuit, and
    an operation of the second transistor is controlled based on a second gate signal from the control circuit.

6. The semiconductor circuit according to claim 5, wherein
    in a case where the first and second switches operate by the operation mode that is a first mode, after the first control signal shifts from a first level to a second level, the first and second transistors are turned on, and
    in a case where the first and second switches operate by the operation mode that is a second mode different from the first mode, the second transistor is turned on in accordance with shifting of the first control signal from the first level to the second level, and the first transistor is turned on after the second transistor is turned on.

7. The semiconductor circuit according to claim 6, wherein in a case where the first and second switches operate by the operation mode that is the second mode, the first transistor is turned off in accordance with shifting of the first control signal from the second level to the first level, and the second transistor is turned off after the first transistor is turned off.

8. The semiconductor circuit according to claim 7, wherein in a case where the first and second switches operate by the operation mode that is the first mode, the first and second transistors are turned off in accordance with shifting of the first control signal from the second level to the first level.

9. The semiconductor circuit according to claim 6, wherein
in the first mode, in a case where a power supply voltage is switched between the first power supply voltage and the second power supply voltage, an output of the power supply voltage is stopped between the output of the first power supply voltage from the switch circuit and the output of the second power supply voltage from the switch circuit, and
in the second mode, in a case where the power supply voltage is switched between the first power supply voltage and the second power supply voltage, an output of a voltage from the switch circuit is continuously switched between the output of the first power supply voltage from the switch circuit and the output of the second power supply voltage from the switch circuit.

10. The semiconductor circuit according to claim 1, wherein the operation mode includes:
a first mode in which a voltage that is output from the switch circuit continuously changes between the first power supply voltage and the second power supply voltage;
a second mode in which an output of the voltage is stopped between the output of the first power supply voltage and the output of the second power supply voltage from the switch circuit;
a third mode in which at a time when the voltage output from the switch circuit changes from the first power supply voltage to the second power supply voltage, the voltage continuously changes from the first power supply voltage to the second power supply voltage, and, at a time when the voltage changes from the second power supply voltage to the first power supply voltage after the voltage changes from the first power supply voltage to the second power supply voltage, the output of the voltage is stopped between the output of the first power supply voltage and the output of the second power supply voltage; and
a fourth mode in which at a time when the voltage changes from the first power supply voltage to the second power supply voltage, the output of the voltage is stopped between the output of the first power supply voltage and the output of the second power supply voltage, and, at a time when the voltage changes from the second power supply voltage to the first power supply voltage after the voltage changes from the first power supply voltage to the second power supply voltage, the voltage continuously changes from the second power supply voltage to the first power supply voltage.

11. The semiconductor circuit according to claim 1, wherein
the switch circuit further includes a third switch configured to control an output of a third power supply voltage, and is configured to switch the first power supply voltage, the second power supply voltage and the third power supply voltage, and
the control circuit is configured to receive a third control signal related to an input of the third power supply voltage, detect the input of the third power supply voltage, and control the operation mode of the switch circuit, based on the first, second and third control signals and a detection result of the first, second and third power supply voltages.

12. The semiconductor circuit according to claim 11, further comprising:
a detection circuit configured to detect the inputs of the first, second and third power supply voltages,
wherein the detection circuit includes:
a first subtraction circuit configured to execute a first subtraction process for two power supply voltages selected from among the first to third power supply voltages;
a second subtraction circuit configured to execute a second subtraction process for the two selected power supply voltages; and
a first circuit configured to activate one of the first subtraction circuit and the second subtraction circuit.

13. The semiconductor circuit according to claim 12, wherein the first circuit activates one of the first and second subtraction circuits, based on a plurality of first signals indicating transition timings of signal levels of the first, second and third control signals, a second signal corresponding to a comparison result between the first power supply voltage and the second power supply voltage, a third signal corresponding to a comparison result between the first power supply voltage and the third power supply voltage, and a fourth signal corresponding to a comparison result between the second power supply voltage and the third power supply voltage.

14. The semiconductor circuit according to claim 12, wherein the detection circuit outputs a mode signal indicating the operation mode to the control circuit, based on a result of the first subtraction process or a result of the second subtraction process.

15. The semiconductor circuit according to claim 14, wherein the control circuit includes:
a driver circuit configured to control operations of the first, second and third switches; and
a gate driver control circuit configured to control the driver circuit by using the mode signal and the first, second and third control signals.

16. The semiconductor circuit according to claim 15, wherein
each of the first, second, and third switches includes:
a first transistor including a first source connected to a power supply system, and a first drain; and
a second transistor including a second source connected to an output terminal, and a second drain connected to the first drain,
an operation of the first transistor is controlled based on a first gate signal from the control circuit, and
an operation of the second transistor is controlled based on a second gate signal from the control circuit.

17. The semiconductor circuit according to claim 16, wherein
in a case where the first, second and third switches operate by the operation mode that is a first mode, after the first control signal shifts from a first level to a second level, the first and second transistors are turned on, and in a case where the first, second and third switches operate by the operation mode that is a second mode different from the first mode, the second transistor is turned on in accordance with shifting of the first control signal from the first level to the second level, and the first transistor is turned on after the second transistor is turned on.

18. The semiconductor circuit according to claim 17, wherein in a case where the first, second and third switches operate by the operation mode that is the second mode, the first transistor is turned off in accordance with shifting of the first control signal from the second level to the first level, and the second transistor is turned off after the first transistor is turned off.

19. The semiconductor circuit according to claim 18, wherein in a case where the first, second and third switches operate by the operation mode that is the first mode, the first and second transistors are turned off in accordance with shifting of the first control signal from the second level to the first level.

20. The semiconductor circuit according to claim 19, wherein
in the first mode of the operation mode, in a case where a power supply voltage is switched between two voltages detected from among the first, second and third power supply voltages, an output of the power supply voltage is stopped between the output of one power supply voltage from the switch circuit and the output of the other power supply voltage from the switch circuit, and in the second mode of the operation mode, in a case where the power supply voltage is switched between two voltages detected from among the first, second and third power supply voltages, an output of a voltage from the switch circuit is continuously switched between the output of the one power supply voltage from the switch circuit and the output of the other power supply voltage from the switch circuit.

* * * * *